(12) United States Patent
Wraback et al.

(10) Patent No.: US 8,269,223 B2
(45) Date of Patent: Sep. 18, 2012

(54) POLARIZATION ENHANCED AVALANCHE PHOTODETECTOR AND METHOD THEREOF

(75) Inventors: Michael Wraback, Germantown, MD (US); Paul Shen, Potomac, MD (US); Anand V Sampath, Montgomery Village, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 13/116,667

(22) Filed: May 26, 2011

(65) Prior Publication Data

US 2011/0291109 A1      Dec. 1, 2011

Related U.S. Application Data

(60) Provisional application No. 61/348,959, filed on May 27, 2010.

(51) Int. Cl.
*H01L 29/15* (2006.01)
(52) U.S. Cl. .......................................... 257/77; 438/105
(58) Field of Classification Search .................... 257/77; 438/105
See application file for complete search history.

(56) References Cited

U.S. PATENT DOCUMENTS

| | | | |
|---|---|---|---|
| 4,935,795 A | 6/1990 | Mikawa et al. |
| 6,326,654 B1 | 12/2001 | Ruden et al. |
| 6,838,741 B2 | 1/2005 | Sandvik et al. |
| 7,049,640 B2 | 5/2006 | Boisvert et al. |
| 2004/0108530 A1 | 6/2004 | Sandvik et al. |
| 2005/0098844 A1 | 5/2005 | Sandvik et al. |

FOREIGN PATENT DOCUMENTS

EP      0082787      6/1983
(Continued)

OTHER PUBLICATIONS

Hawkins, A., "High Gain-bandwidth-product Silicon Heterointerface Photodetector," Applied Physics Letter, 70 (3) 20 (Jan. 1997), pp. 303-305.

(Continued)

*Primary Examiner* — Douglas Menz
(74) *Attorney, Agent, or Firm* — Alan I. Kalb

(57) ABSTRACT

An avalanche photodetector comprising a multiplication layer formed of a first material having a first polarization; the multiplication layer having a first electric field upon application of a bias voltage; an absorption layer formed of a second material having a second polarization forming an interface with the multiplication layer; the absorption layer having a second electric field upon application of the bias voltage, the second electric field being less than the first electric field or substantially zero, carriers created by light absorbed in the absorption layer being multiplied in the multiplication layer due to the first electric field; the absorption layer having a second polarization which is greater or less than the first polarization to thereby create an interface charge; the interface charge being positive when the first material predominately multiplies holes, the interface charge being negative when the first material predominately multiplies electrons, the change in electric field at the interface occurring abruptly at the atomic level; the interface charge creating electric field discontinuity causing first electric field to attain the breakdown field in the multiplication region and the second electric field to be low or zero in the absorption layer to thereby eliminate the need for a doped charge layer and the associated thickness of the doped charge layer required to transition from the low field to the high field. Also claimed is a method of making.

20 Claims, 31 Drawing Sheets

Polarization Enhanced SEPARATE ABSORPTION MULTIPLICATION (SAM)-AVALANCHE PHOTODETECTOR (APD)

FOREIGN PATENT DOCUMENTS

| EP | 0150564 | 8/1985 |
|----|---------|--------|
| EP | 2175497 A2 | 4/2010 |

OTHER PUBLICATIONS

Campbell, J. C., "Recent advances in telecommunications avalanche photodiodes," J. of Lightwave Tech., vol. 25, No. 1, p. 109-121, Jan. 2007.

M. Liu. et al. "Low dark count rate and high single-photon detection efficiency avalanche photodiode in Geiger-mode operation," IEEE Phot. Tech. Lett. 19, 378-80, (2007).

J. B. Limb et al., "GaN ultraviolet avalanche photodiodes with optical gain greater than 1000 grown on GaN substrates by metal-organic chemical vapor deposition" Appl. Phys. Lett 89, 011112 (2006).

Danielsson, E., et al. "The influence of band offsets on the IV characteristics for GaN/SiC heterojunctions." Sol. State Electron., vol. 46, pp. 827-835, (2002).

Konstantinov, A. O., et al."Ionization rates and critical fields in 4H silicon carbide," Appl. Phys. Lett., vol. 71, No. 1, pp. 90-92, 1997.

Vurgaftman, I. et al. "Band Parameters for Nitrogen-containing Semiconductors," J. Appl. Phys. 2003, 94, 3675-96.

S. Bai et al, "Determination of the Electric the 4H/3C/4H-SiC Quantum Wells Due to Spontaneous Polarization in the 4H SiC Matrix" Appl. Phys. Lett. 2003, 83, 3171-3173.

Perry, W.G., et al. "Correlation of biaxial strains, bound exciton energies, and defect microstructures in gan films grown on AlN/6H-SiC(0001) substrates," Journal Electron, Mater. 26, 224 (1997).

Gou, X., "Demonstration of Ultraviolet Separate Absorption and Multiplication 4H-SiC Avalanche Photodiodes," IEEE Photonics Technology Letters, vol. 18, No. 1, pp. 136-138 (2006).

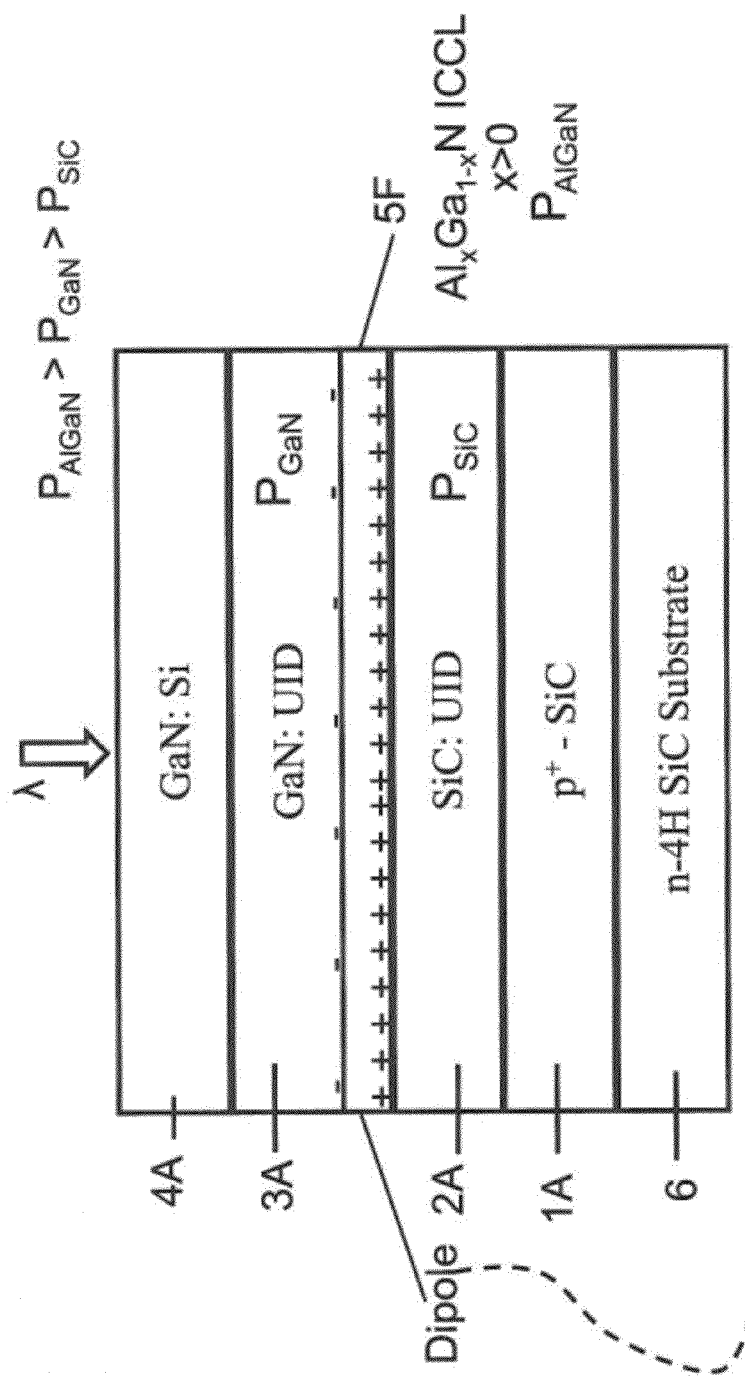
FIG. 24 For GaN absorber and a SiC multiplication region the ICCL could be AlGaN or AlN

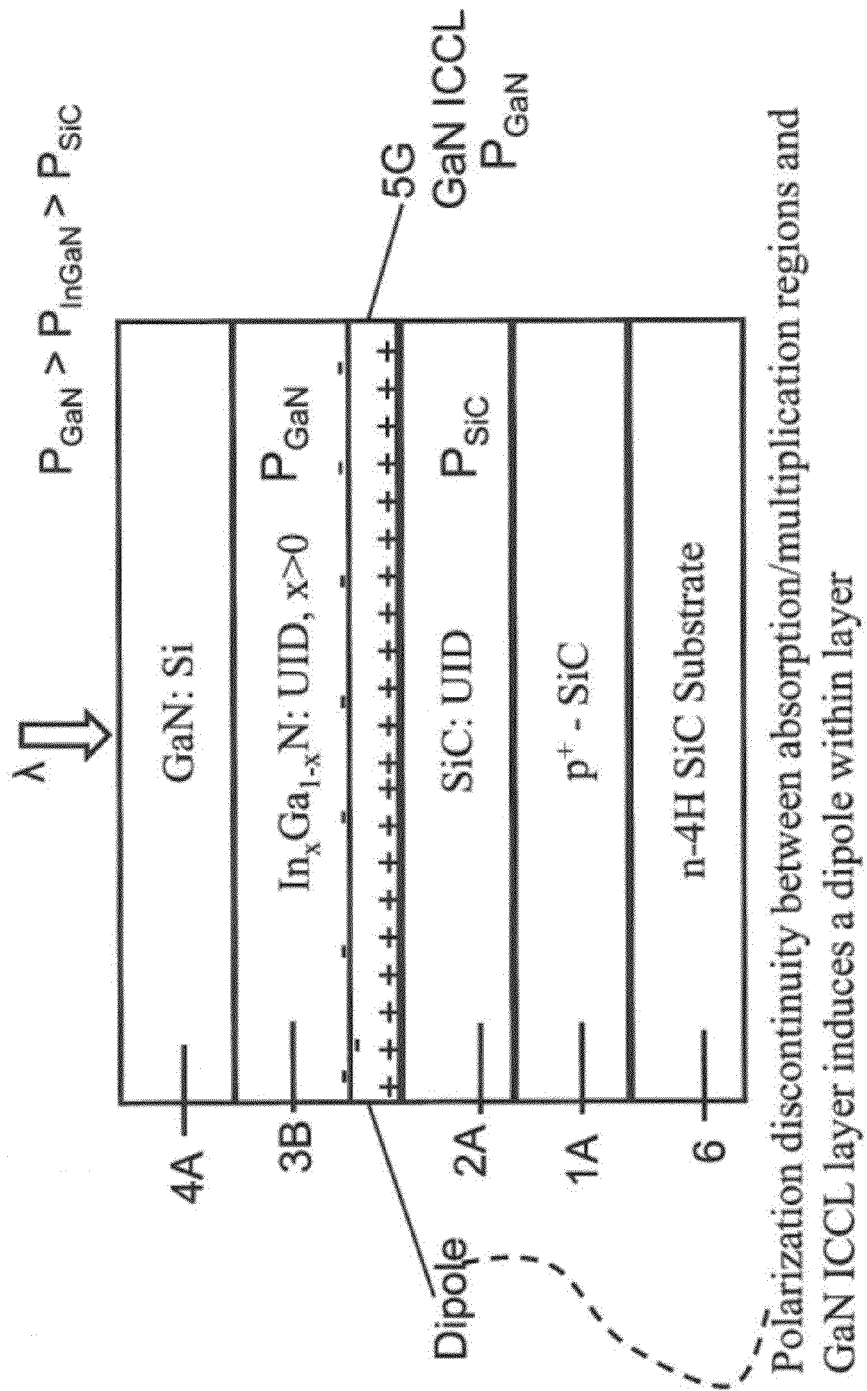
FIG. 25 InGaN/SiC PE-SAM APD employing a GaN ICCL.

Band diagram of a GaN/SiC APD under reverse bias

With electric field confined in the SiC multiplication region due to the presence of polarization induced charge σ at the interface Band diagram of a GaN/SiC APD under reverse bias With electric field showing punch-through into the GaN absorption region Calculation of the electric field and band diagram in a GaN/SiC SAM APD accounting for spontaneous polarization charge for the case where the GaN layer is compressively strained.

Calculation of the electric field and band diagram in a GaN/SiC SAM APD accounting for spontaneous polarization charge for the case where an AlN ICCL is employed.

POLARIZATION ENHANCED AVALANCHE PHOTODETECTOR AND METHOD THEREOF

CROSS REFERENCE TO RELATED APPLICATIONS

This application claims priority of U.S. Provisional Application No. 61/348,959 entitled "Polarization Enhanced Substantially Separate Absorption and Multiplication Avalanche Photodiode System and Method Thereof," by Michael Wraback, et al., filed May 27, 2010, hereby incorporated herein by reference.

GOVERNMENT INTEREST

The embodiments herein may be manufactured, used, and/or licensed by or for the United States Government without the payment of royalties thereon.

BACKGROUND OF THE INVENTION

In avalanche photodiodes or photodetectors, incoming light is used to generate carriers (i.e., free electrons or holes). Once the avalanche breakdown begins, the carriers are accelerated by the electric field to very high speeds striking other atoms and knocking carriers free from another atom, and ionizing it. As this process continues the number of free carriers moving through the material increases exponentially; often in just picoseconds. The avalanche multiplication process takes place in the multiplication portion of the photodetector. The carriers are absorbed for conversion to electrical current in the absorption portion of the photodetector.

An avalanche photodiode (APD) semiconductor device has a built-in first stage of gain through avalanche multiplication. Using a high reverse bias voltage (typically 100-200 V in silicon), APDs show an internal current gain effect (around 100) due to impact ionization, which is commonly referred to as avalanche effect. Gain in an avalanche device is achieved through photogenerated charge carrier impact ionization and a resultant multiplication of total charge carriers available. Typical applications for APDs include laser rangefinders and long range fiber optic telecommunication. Parameters for judging the usefulness of APDs for a particular application include quantum efficiency, or the efficiency related to the absorption of incident optical photons and subsequent generation of primary charge carriers; total dark current, noise equivalent power, spectral sensitivity range and operating voltage.

Semiconductor materials are selected for photodiodes based upon the wavelength range of the radiation that is desired to be utilized or detected. Group III-nitride avalanche detectors can presumably be widely functional between 1900 nm to 200 nm (i.e. infrared radiation to ultraviolet). Generally, the binaries utilized in such semiconductor devices are Indium Nitride (bandgap of 0.65 eV corresponding to approximately 1900 nm), Gallium Nitride (band gap of 3.4 eV corresponding to approximately 365 nm) and Aluminum Nitride (bandgap of 6.1 eV corresponding to approximately 200 nm). By varying the relative mole fractions of the binaries, ternary or quaternary alloys may be composed that can achieve radiation absorption at intermediate wavelengths to the stated values.

U.S. Pat. No. 6,326,654 to Ruden in (hereinafter Ruden '654; hereby incorporated by reference) entitled "A Hybrid Ultraviolet Detector," discloses what appears to be a semiconductor material avalanche photodiode photodetector. However, Ruden '654 does not take advantage of the polarization properties of III-Nitride semiconductor material; in fact it is completely ignored.

SUMMARY

A preferred embodiment of the present invention comprises an avalanche photodetector comprising a multiplication layer formed of a first material having a first polarization; the multiplication layer having a first electric field upon application of a bias voltage; an absorption layer formed of a second material having a second polarization forming an interface with the multiplication layer; the absorption layer having a second electric field upon application of the bias voltage, the second electric field being less than the first electric field or substantially zero, carriers created by light absorbed in the absorption layer being multiplied in the multiplication layer due to the first electric field; the absorption layer having a second polarization which is greater or less than the first polarization to thereby create an interface charge; the interface charge being positive when the first material predominately multiplies holes, the interface charge being negative when the first material predominately multiplies electrons, the change in electric field at the interface occurring abruptly at the atomic level; the interface charge creating electric field discontinuity causing first electric field to attain the breakdown field in the multiplication region and the second electric field to be low or zero in the absorption layer to thereby eliminate the need for a doped charge layer and the associated thickness of the doped charge layer required to transition from the low field to the high field.

In a preferred embodiment, the photodetector is an avalanche photodetector in which the need for a doped charge layer is eliminated, such that the transition from the low field in the absorption layer to the breakdown field in the multiplication layer occurs abruptly on the atomic scale at the interface and the required transition distance is eliminated resulting in only the minimum voltage being necessary to achieve the breakdown field required to trigger the avalanche breakdown.

A preferred embodiment of the invention may comprise first and second electrodes having a voltage potential therebetween sufficient to create a high first electric field in the multiplication layer for avalanche breakdown; the interface charge operating to confine the high first electric field to the multiplication layer, the high first electric field being the field required for avalanche breakdown, while a low or zero second electric field is maintained in the absorption layer.

In another preferred the multiplication layer is silicon carbide and the absorption layer may be any one of gallium nitride, indium gallium nitride, aluminum gallium nitride, indium aluminum gallium nitride, indium aluminum nitride, boron aluminum nitride, boron aluminum gallium nitride, aluminum nitride, boron nitride, indium nitride.

Another preferred embodiment may include an optional interface charge control layer for creating a field in the absorption layer. The interface charge control layer preferably has a thickness in the range of approximately 2 to 20 nm. The optional interface charge control layer being located between the multiplication layer and the absorption layer, constructed so the differential between the polarization of the absorption layer and polarization of the multiplication layer is in excess of the product of the breakdown field and the permittivity of the absorption layer relative to free space; the interface charge control layer operating to create a field in the absorption layer by reducing the effective interface charge until it is less than the product of the breakdown field of multiplication layer and the permittivity of the absorption layer relative to free space.

Another preferred embodiment photodetector comprises a P-N diode having an absorption layer material formed of a Group V or Group VI polar p-type material suitable for injection of electrons into the multiplication region. The materials being selected and oriented so that the direction of polarization vectors P1 and P2 are from absorption layer towards the multiplication layer and magnitude of P2 is greater than magnitude of P1 such that the interface charge is negative.

Another preferred embodiment photodetector comprises a P-N diode where the absorption layer comprises a Group V or Group VI polar n-type material suitable for injection of holes into the multiplication region and where the direction of polarization vectors P1 and P2 are from absorption layer towards the multiplication layer and magnitude of P2 is less than magnitude of P1 such that the interface charge is positive.

Another preferred embodiment photodetector comprises a P-N diode having an absorption layer comprising a Group II or Group III polar p-type material suitable for injection of electrons into the multiplication region and where the direction of polarization vectors P1 and P2 are from the multiplication layer towards the absorption layer and magnitude of P2 is less than magnitude of P1 such that the interface charge is negative.

Another preferred embodiment photodetector comprises a photodetector having a second polarization that is greater than the first polarization and wherein the optional interface charge control layer has a third polarization greater than the second polarization that operates to effectively reduce the positive interface charge between the multiplication layer and the charge control layer. Alternately, the third polarization may be graded to the second polarization by grading the composition of the interface charge control layer down to that of the composition of the absorption layer.

Another preferred embodiment photodetector comprises an optional interface charge control layer that is grown on the multiplication layer such that the polarization of the charge control layer is greater than the second polarization and induces a two dimensional electron gas σ2DEG at the interface between the multiplication layer and the charge control layer that compensates the positive interface charge such that $(\sigma - \sigma_{2DEG})/\in\in_o$ is less than $F_{br}$, where σ is the interface charge, $\sigma_{2DEG}$ is a two dimensional electron gas, $F_{br}$ is the breakdown field and $\in\in_o$ is the permittivity of the absorption layer relative to free space.

Another preferred embodiment photodetector comprises a photodetector wherein the optional interface charge control layer comprises one of the group of gallium nitride, indium gallium nitride, aluminum gallium nitride, indium aluminum gallium nitride, indium aluminum nitride, boron aluminum nitride, boron aluminum gallium nitride, aluminum nitride, boron nitride, indium nitride provided that the third polarization is greater than the second polarization.

Another preferred embodiment photodetector comprises a photodetector that is a P-N diode having an absorption layer comprising a Group II or Group III polar n-type material and where the direction of vectors P1 and P2 are from multiplication layer towards the absorption layer and wherein the second polarization is greater than the first polarization and wherein the interface charge control layer is doped with acceptors and the ionized acceptors create a negative space charge that operates to effectively reduce the positive interface charge between the multiplication layer and the charge control layer.

Another preferred embodiment photodetector comprises a photodetector having a multiplication layer formed of silicon carbide and an absorption layer formed of gallium nitride, indium gallium nitride, aluminum gallium nitride, indium aluminum gallium nitride, indium aluminum nitride, boron aluminum nitride, boron aluminum gallium nitride, aluminum nitride, boron nitride, or indium nitride with an optional interface charge control layer comprising magnesium doped material of the absorption layer.

Another preferred embodiment photodetector comprises an avalanche photodetector having a multiplication layer having a first polarization and a breakdown field; an absorption layer having a second polarization, the differential between the polarization of the absorption layer and polarization of the multiplication layer being in excess of the product of the breakdown field and the permittivity of the absorption layer relative to free space, an interface charge control layer for creating a field in the absorption layer, the interface charge control layer being located between the multiplication layer and the absorption layer, whereby the interface charge control layer operates to create a field in the absorption layer by reducing the effective interface charge until it is less than the product the breakdown field of multiplication layer and the permittivity of the absorption layer relative to free space.

In the preferred embodiments, the photodetector may have a multiplication layer formed of silicon carbide, an absorption layer formed of gallium nitride, indium gallium nitride, aluminum gallium nitride, indium aluminum gallium nitride, indium aluminum nitride, boron aluminum nitride, boron aluminum gallium nitride, aluminum nitride, boron nitride, or indium nitride and the optional interface charge control layer may be magnesium doped material of the absorption layer.

A preferred method of forming an avalanche photodetector comprises providing a substrate; forming a first doped semiconductor layer suitable for making electrical contact; forming a multiplication layer on the first doped semiconductor layer; the multiplication layer having a first polarization; forming an interface charge control layer on the multiplication layer, forming an absorption region on the interface charge control layer; the absorption layer having a second polarization; the interface charge control layer operating to create a field in the absorption layer, the interface charge control layer operating to create a charge that enables a transition between the high electric field desired in the multiplication layer to ensure large gain and the low electric field in the absorption layer to efficiently collect photon generated carriers; forming a second doped semiconductor layer suitable for making electrical contact on the absorption layer. Optionally, the differential between the polarization of the absorption layer and polarization of the multiplication layer may be in excess of the product of the breakdown field and the permittivity of the absorption layer relative to free space, the interface charge control layer operating to create a field in the absorption layer by reducing the effective interface charge until it is less than the product the breakdown field of multiplication layer and the permittivity of the absorption layer relative to free space.

As shown in FIG. 1, the preferred embodiment illustrated comprises a multiplication metal contact layer 1 and an absorption region metal contact layer 4, a semiconductor absorption region (or layer) 3 having a total polarization P2 which is not equal to P1, and a semiconductor multiplication region (or layer) 2 having a total polarization P1. As shown in FIG. 2, this preferred embodiment device has the significant advantage that the interface charge that arises due to the discontinuity in polarization at the interface between layer 2 and 3 enables a very sharp transition between the high electric field desired in the multiplication region to ensure large gain and the low electric field desired in the absorption region to efficiently collect photogenerated carriers. As a result, this structure does not require a charge layer, and the significant voltage penalty associated with a charge layer, commonly employed in a separate absorption, charge and multiplication avalanche photodiode (SACM-APD), to control the transition of the electric field from the multiplication to the absorption region (see FIG. 2 top).

BRIEF DESCRIPTION OF THE DRAWINGS

FIG. 24 illustrates the structure of a GaN/SiC PE-SAM APD employing a III-Nitride ICCL. Polarization discontinuity between absorption/multiplication regions and the III-Nitride ICCL layer induces a dipole within layer that induces a two dimensional electron gas $\sigma_{2DEG}$ at the interface such that $F_{SiC}>(\sigma-\sigma_{2DEG})/\epsilon\epsilon_o$ and $F_{GaN}>0$.

FIG. 25 illustrates the structure of an InGaN/SiC PE-SAM APD employing a GaN ICCL. Polarization discontinuity between absorption/multiplication regions and GaN ICCL layer induces a dipole within layer that induces a two dimensional electron gas $\sigma_{2DEG}$ at the interface such that $F_{SiC}>(\sigma-\sigma_{2DEG})/\epsilon\epsilon_o$ and $F_{InGaN}>0$.

DETAILED DESCRIPTION OF THE PREFERRED EMBODIMENTS

Figure 1:
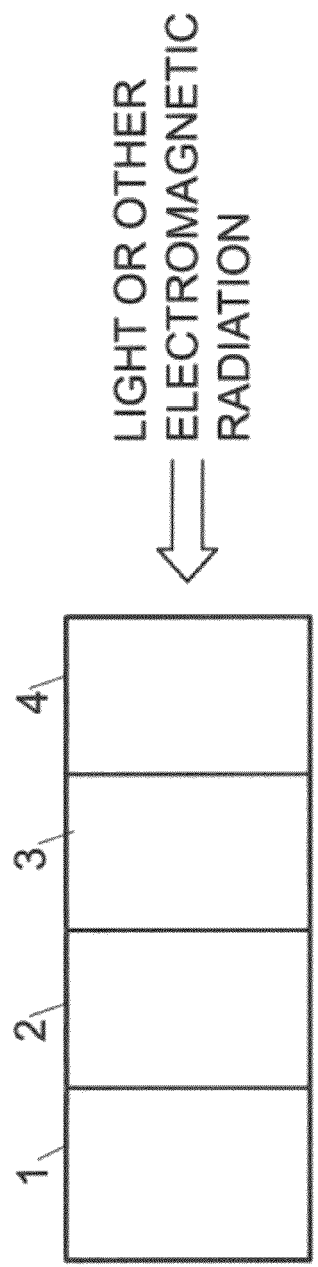
FIG. 1 is a schematic illustration of a polarization enhanced SAM-APD.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention. Rather, these embodiments are provided so that this disclosure will be thorough and complete, and will fully convey the scope of the invention to those skilled in the art. In the drawings, the dimensions of objects and regions may be exaggerated for clarity. Like numbers refer to like elements throughout. As used herein the term "and/or" includes any and all combinations of one or more of the associated listed items.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various ranges, elements, components, regions, layers and/or sections, these elements, components, regions, layers and/or sections should not be limited by these terms. For example, when referring first and second ranges, these terms are only used to distinguish one range from another range. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

A preferred embodiment of the present invention includes a polarization enhanced; separate absorption and multiplication avalanche layers in a photodiode for novel high-performance that combines the high quantum efficiency of a direct band gap material with a material having superior avalanche multiplication properties similar to what is widely employed for InGaAs/InP telecommunications avalanche photo detectors (APDs) (as described in Campbell, J. C., "Recent advances in telecommunications avalanche photodiodes," *J. of Lightwave Tech.*, Vol. 25, no. 1, p 109-121, January 2007, hereby incorporated by reference). However, in contrast to a traditional separate absorption multiplication (SAM) region system, a preferred embodiment polarization enhanced (PE) separated absorption multiplication regions avalanche photodetector (SAM-APD) employs an absorption region and an adjacent multiplication region composed of semiconductors having different magnitudes and/or directions of polarization (both spontaneous and/or piezoelectric) that result in the formation of beneficial polarization interface charge at their hetero-interface (FIG. 1).

The formation of this beneficial polarization interface charge at the hetero-interface for a PE-SAM APD provides the significant improvement in that it enables the sharp transition from a desirable large electric field in the multiplication region to a low or zero electric field on nearly the atomic scale, thereby eliminating the need for the conventionally employed charge layer, and the concomitant higher operating voltage penalty associated with it.

As shown in FIG. 1, a preferred embodiment polarization enhanced SAM-APD comprising a multiplication metallic contact region or layer 1, a semiconductor multiplication region or layer 2 having a total polarization P1, a semiconductor absorption region or layer 3 having a total polarization of P2, where P2 is less than or greater than P1, and an absorption metallic contact region or layer 4. As used herein the term P in bold face represents the magnitude of the polarization vector. The regions and/or layers 1-4 may have a variety of configurations, sizes, shapes, widths, lengths, depths and chemical compositions and each layer may be the same, similar or different from the other layers. Moreover, the metallic contact regions or layers 1 and 4 may vary in position, size, and location, depending upon the requirements of the application.

Figure 2:
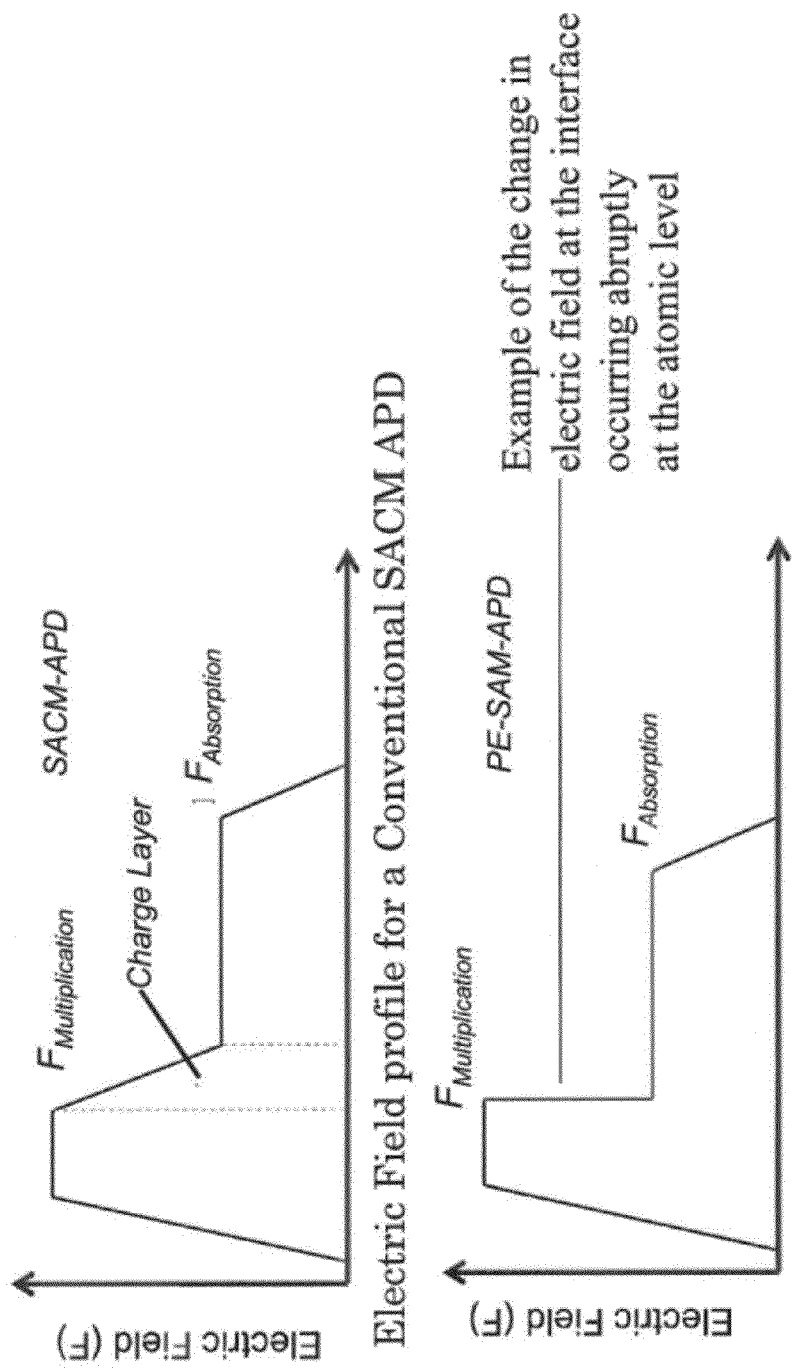
FIG. 2 is graphical illustration of a comparison of the electric profile for a conventional SACM APD and the Electric Field Profile for a polarization enhanced SAM APD.

The preferred embodiment of FIG. 1 has the significant advantage that the interface charge formed between layer 2 and layer 3 enables a very sharp or abrupt transition on the atomic scale between the high electric field desired in the multiplication layer 2 to ensure large gain and the low electric field desired in the absorption layer 3 to efficiently collect photogenerated carriers (see bottom of FIG. 2). In contrast to the conventional charge layer is commonly employed to achieve this transition resulting in a decrease in the electric field over a substantial length as shown in FIG. 2 TOP. These devices are commonly referred to as separate absorption, charge and multiplication avalanche photodiode (SACM-APD) A PE-SAM-APD of the current invention does not require a conventional charge layer of the prior so and therefore does not suffer from the significant voltage penalty associated with it.

Figure 3:
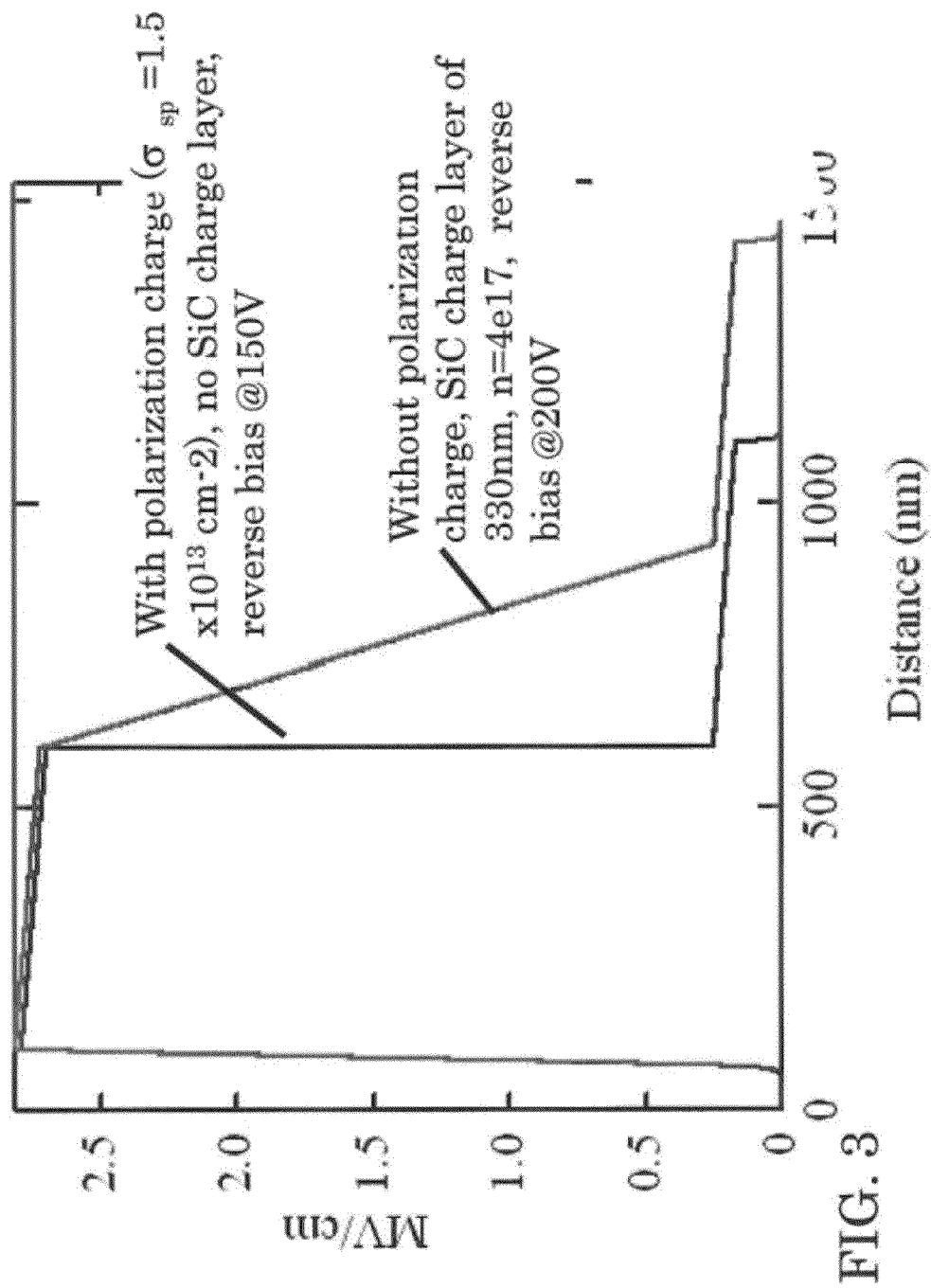
FIG. 3 illustrates a comparison of the electric field profiles in $In_{0.25}Ga_{0.75}N$/SiC PE-SAM APDs due to the effect of positive interface polarization charge and using a conventional charge layer.

As an example, FIG. 3 compares the calculated the electric field profiles for preferred embodiment of the current invention $In_{0.25}Ga_{0.75}N/SiC$ PE-SAM APD that takes advantage of the formation of positive polarization charge at the interface between the InGaN absorption layer and the SiC multiplication layer and a similar structure that neglects the polarization charge and instead employs an n-type doped SiC charge layer of the conventional devices. In particular, FIG. 3 illustrates the potential benefits of the preferred embodiment positive polarization charge for an $In_{0.25}Ga_{0.75}N/SiC$ SAM APD; The theoretically predicted polarization charge of $\sigma_{sp}=1.5\times10^{13}$ $cm^{-2}$ at the hetero-interface is sufficient to maintain a low field in the InGaN absorption region and provide a rapid acceleration into the high field region required for impact ionization (see FIG. 3 line labeled "with polarization charge . . . "), without any n-SiC charge layer. If one were to neglect this polarization charge, a 330 nm-thick n-type SiC charge layer with $n=4\times10^{17}$ $cm^{-3}$ would be needed to generate the positive charge that would replicate the field profiles in the absorption and multiplication layers of the device containing polarization charge at the hetero-interface. The requirement for a charge layer increases the voltage required to attain the same field profile from 150 V to 200 V (see FIG. 3 line labeled "without polarization . . . "). This sharp field transition may also provide the additional benefit of suppressing hole trapping at the III-Nitride/SiC interface and improve hole injection from the absorption layer into the multiplication layer because of the more rapid transition from the low field to high field sections of the device.

Figure 4:
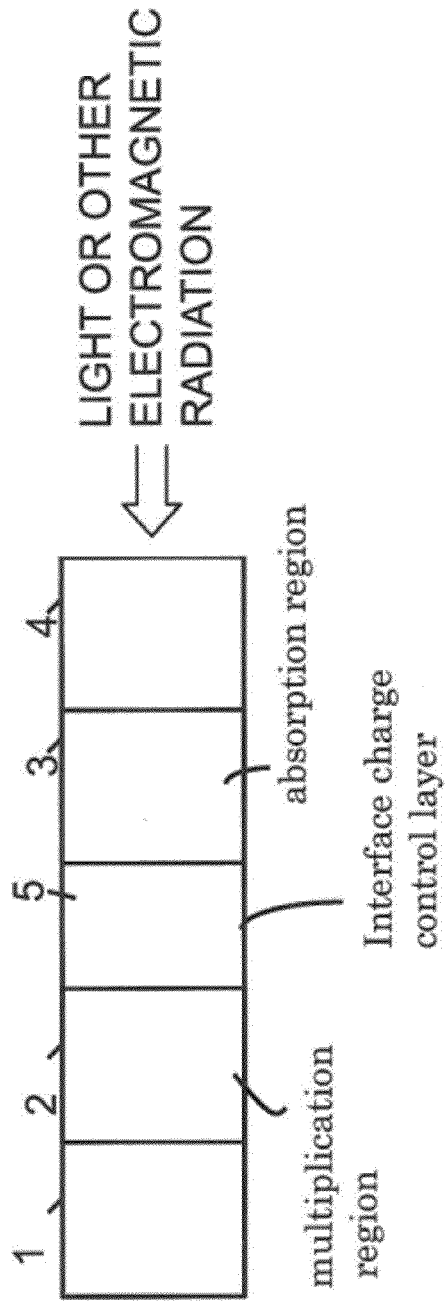
FIG. 4 is a schematic illustration of a polarization enhanced SAM-APD with an interface charge control layer.

FIG. 4 is a schematic illustration of a preferred embodiment of the current invention polarization enhanced SAM-APD with an optional interface charge control layer 5. For the case where the interface charge is substantially large and non-zero electric field is desirable in the absorption layer, the optional interface charge control layer (ICCL) 5 may be inserted between the multiplication region or layer 2 and the absorption region or layer 3 and would act to control the total density of interface charge in any combination of the following methods that includes 1) introducing appropriate dopants or impurities, 2) modifying the strain state of the absorption/multiplication region at the interface, and/or 3) introducing a material having a different magnitude and/or direction of polarization so as to increase/reduce the net density of charge at the interface $\sigma_{net}$. It is important to note that the net interface charge in this case is the sum of the contribution of the polarization induced charge and the charge associated with the ICCL. This optional interface charge control layer (ICCL) feature facilitates tailoring the electric field profile of the device to ensure a sharp transition between the high electric field desired in the multiplication layer 2 to ensure large gain and the low electric field desired in the absorption layer 3 to efficiently collect photogenerated carriers while substantially reducing the voltage penalty associated with employing a charge layer. The electric field profile for a conventional SAM APD employing a charge layer is illustrated in FIG. 2 bottom for comparison. The regions and/or layers 1-5 may have a variety of configurations, sizes, shapes, widths, lengths, depths and chemical compositions, and each layer may be the same, similar or different from the other layers. Moreover, the metallic contact regions or layers 1 and 4 may vary in position, size, and location, depending upon the requirements of the application.

Figure 5:
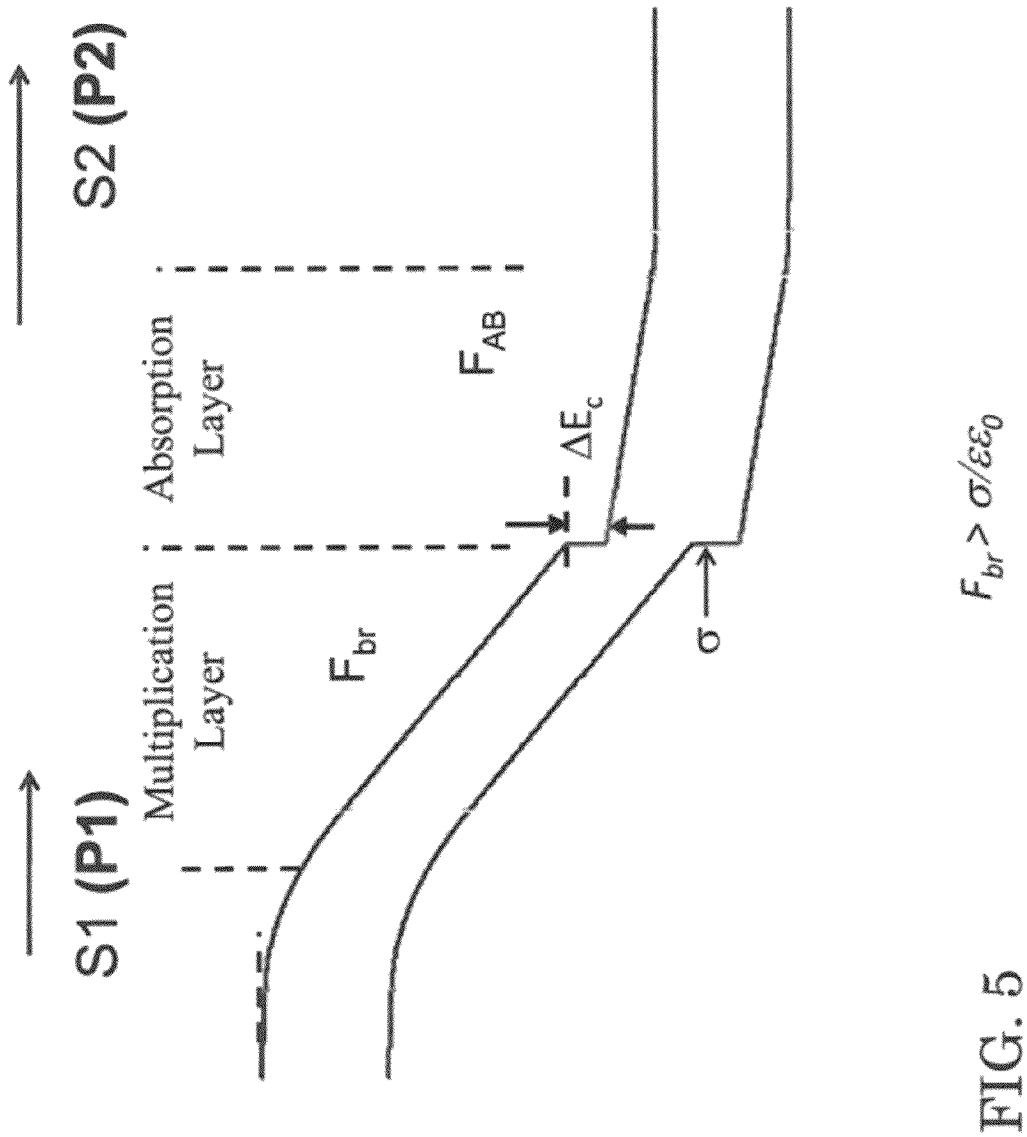
FIG. 5 illustrates an energy level diagram for a p-down SAM APD structure containing a multiplication region with combined spontaneous and piezoelectric polarization P1 and absorption region with combined spontaneous and piezoelectric polarization P2. If P2 is greater than P1, there will be a positive charge a at the hetero-interface of the multiplication and absorption regions. If the breakdown field $F_{br}$ in the multiplication region is larger than $\sigma/\epsilon\epsilon_o$, there will be a field in the absorption region $F_{AB}$. For the proper choice of P2 and P1, the desired effect is attained of having $F_{br}$ much greater than $F_{AB}$, but $F_{AB}$ large enough to sweep carriers photogenerated in the absorption region into the multiplication region.

FIG. 5 illustrates a energy band diagram for a p-down SAM APD structure under reverse bias and comprising a S1 semiconductor multiplication layer (with combined spontaneous and piezoelectric polarization P1) and a S2 semiconductor absorption layer (with combined spontaneous and piezoelectric polarization P2), where P2 is greater than P1. In as much as $P_2$ is greater than $P_1$, there will be a positive charge a at the hetero-interface of the multiplication and absorption regions. If the breakdown field $F_{br}$ in the multiplication region is larger than $\sigma/\epsilon\epsilon_o$, there will be a field in the absorption region $F_{AB}$ ($.F_{AB}>0$). For the proper choice of P2 and P1, the desired effect is attained of having $F_{br}$ much greater than $F_{AB}$, but $F_{AB}$ large enough to sweep carriers photogenerated in the absorption layer into the multiplication layer. This case also results in a sharp electric field transition on the atomic scale from the low field absorption region to the high field multiplication region. As shown by $\sigma$ in FIG. 5, a positive polarization charge density $\sigma$ exists at the hetero-interface that is sufficiently large so that $F_{br}>\sigma/\epsilon\epsilon_0$, resulting in $F_{AB}>0$.

Figure 6:
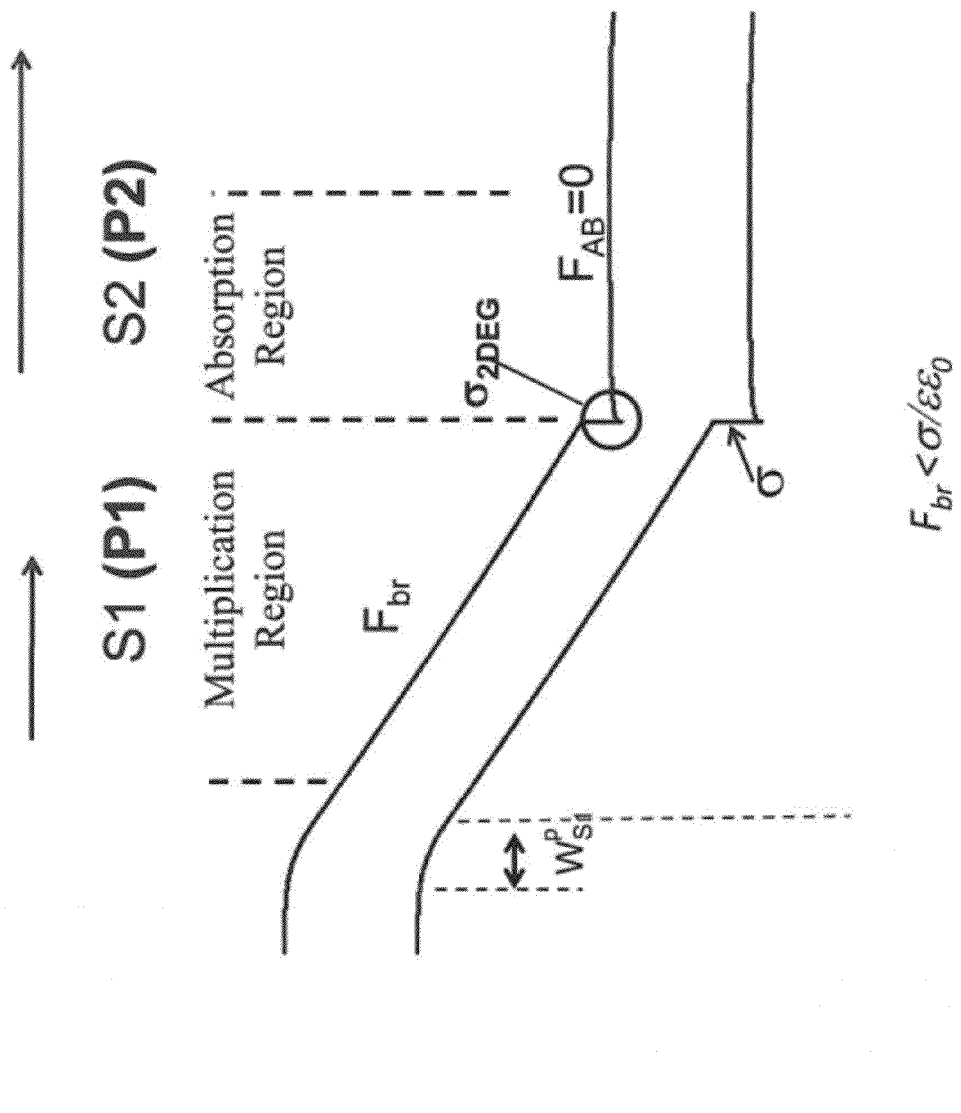
FIG. 6 is an illustration of the band diagram for a PE-SAM APD under reverse bias and a positive polarization charge density $\sigma$ exists at the hetero-interface that is substantially large so that, $F_{br}<\sigma/\epsilon\epsilon_o$, and $F_{AB}\sim 0$.

If $F_{br}$ is less than $\sigma/\epsilon\epsilon_o$, there will be no field in the absorption region ($F_{AB}$) that will aid transport to the multiplication region. FIG. 6 is an illustration of the energy band diagram for a PE-SAM APD under reverse bias and comprised of a multiplication region composed of semiconductor S1 having polarization P1 and an absorption region composed of a semiconductor S2 and having polarization P2 substantially greater than P1. A positive polarization charge density $\sigma$ exists at the hetero-interface that is substantially large such that $F_{br}<\sigma/\epsilon\epsilon_0$ prior to breakdown of the multiplication layer and the electric field is confined within this layer ($F_{AB}\sim0$). This case is desirable for detectors that rely upon the diffusion of photogenerated holes from the absorption layer into the multiplication layer to collect carriers.

However, in this case it can also be desirable to have $F_{AB}>0$ so as to increase the response time of the detector or to increase the quantum efficiency of the detector due to the presence of trap states at the interface between the absorption layer and the multiplication layer that act to reduce the efficiency of photogenerated hole collection by diffusion. In this case, it is possible to partially compensate the positive charge at the interface by inserting a thin delta doped p-type or acceptor doped interface charge control layer (PICCL), which will introduce negative charge at the interface. The PICCL may be inserted in either the absorption layer material, as shown in FIG. 7, or in the multiplication layer material as shown in FIG. 8.

Figure 7:
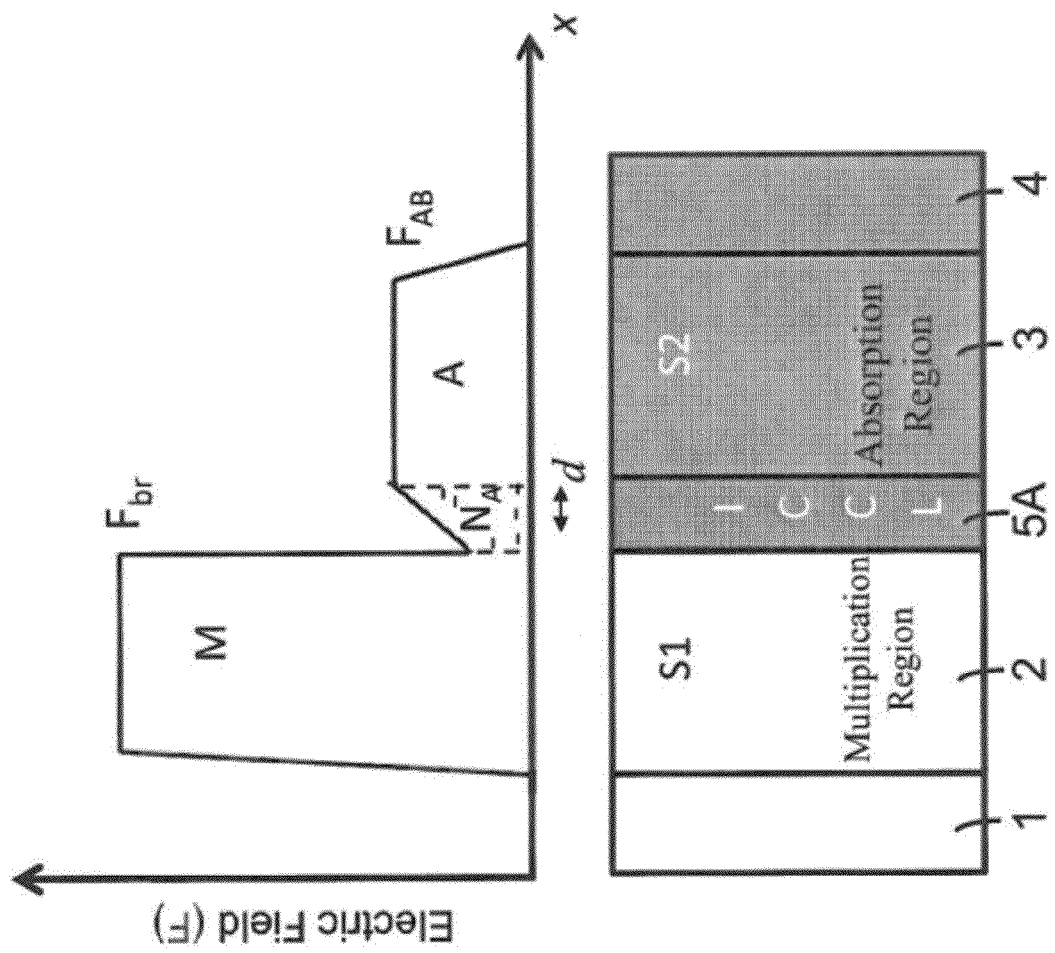
FIG. 7 is an illustration of electric field profile in a PE-SAM APD that employs a thin delta doped p-type or acceptor doped interface charge control layer (PICCL) in the absorption region material, so that $F_{br}>(\sigma\_N_Ad)/\epsilon\epsilon_o$, and $F_{AB}>0$.

FIG. 7 is an illustration of the electric field profile for a preferred embodiment PE-SAM APD under reverse bias where $F_{br}$ is less than $\sigma/\epsilon\epsilon_o$, resulting in substantially no field in the absorption region that will aid transport to the multiplication region. By inserting a thin delta doped p-type or acceptor doped interface charge control layer (PICCL) 5A in the absorption region material, between the multiplication layer 2 and the absorption region 3, it is possible to introduce negative ionized acceptors located in close proximity to the hetero-interface between layers 2 and 5A; this charge will partially compensate the positive polarization interface charge at the interface such that the net interface charge density is $\sigma_{net}=\sigma-qN_a d$ where $\sigma$ is the positive polarization induced charge, $N_a$ is the acceptor doping concentration in the delta doped ICCL layer and d is the thickness of the delta doped ICCL layer. Then for this case the desirable result may be accomplished that $F_{br}>(\sigma-qN_a d)/\in\in_0$, and $F_{AB}>0$. As used herein, the terminology "delta doped" layer refers to a very narrow or thin layer having a very high dopant concentration.

The delta doped p-type ICCL layer 5A (FIG. 7) feature facilitates tailoring the electric field profile of the device to ensure an atomically sharp transition between the high electric field desired in the multiplication layer 2 to ensure large gain and the low (but non-zero) electric field desired in the absorption layer 3 to efficiently collect photogenerated carriers while substantially reducing the voltage penalty associated with employing a charge layer. The electric field profile for a conventional SAM APD employing a charge layer is illustrated in FIG. 2 bottom for comparison.

Figure 8:
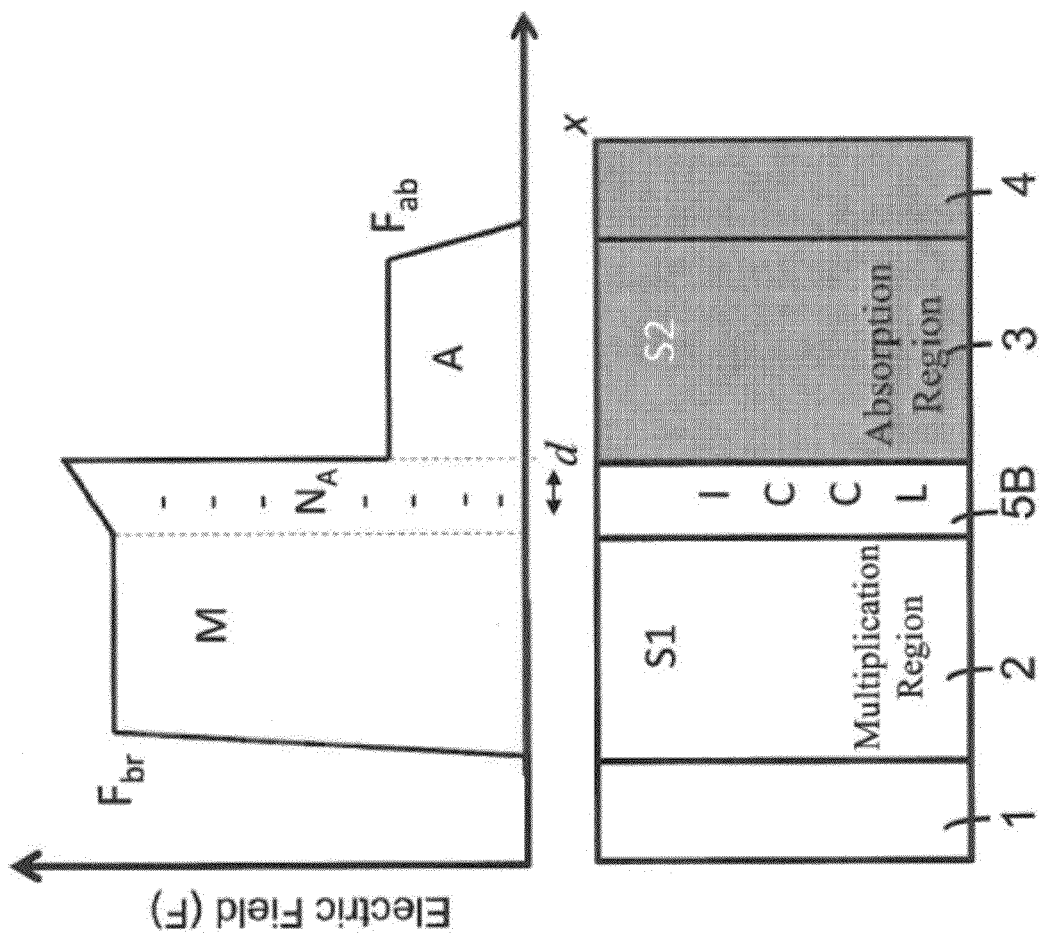
FIG. 8 is an illustration of electric field profile in a PE-SAM APD that employs a thin delta doped p-type or acceptor doped interface charge control layer (PICCL) in the multiplication layer material, so that $F_{br}>(\sigma-N_Ad)/\epsilon\epsilon_o$, and $F_{AB}>0$.

FIG. 8 depicts the alternative placement of the PICCL in the multiplication region material at the hetero-interface. Specifically, FIG. 8 is an illustration of the electric field of a preferred embodiment PE-SAM APD under reverse bias and comprising a multiplication layer 2 and an ICCL 5B composed of semiconductor 51 that has a polarization P1, and an absorption layer 3 consisting of S2 that has polarization P2, and where P2 is substantially greater than P1. FIG. 8 is an illustration of the case where $F_{br}$ is less than $\sigma/\in\in_o$, resulting in substantially no field in the absorption region that will aid transport to the multiplication region. By inserting a thin delta doped p-type or acceptor doped interface charge control layer (PICCL) multiplication region material at the hetero-interface, it is possible to introduce negative ionized acceptors located in close proximity to the interface so as to partially compensate the positive polarization interface charge at the interface such that the net interface charge density is $\sigma_{net}=\sigma-qN_a d$ where $\sigma$ is the positive polarization induced charge, $N_a$ is the acceptor doping concentration in the delta doped ICCL layer and d is the thickness of the delta doped ICCL layer. Then for this case the desirable result may be accomplished that $F_{br}>(\sigma-qN_a d)/\in\in_0$, and $F_{AB}>0$.

The delta doped p-type ICCL layer 5B (FIG. 8) feature facilitates tailoring the electric field profile of the device to ensure an atomically sharp transition between the high electric field desired in the multiplication layer 2 to ensure large gain and the low (but non-zero) electric field desired in the absorption layer 3 to efficiently collect photogenerated carriers while substantially reducing the voltage penalty associated with employing a charge layer. The electric field profile for a conventional SAM APD employing a charge layer o is illustrated in FIG. 2 bottom for comparison.

Figure 9:
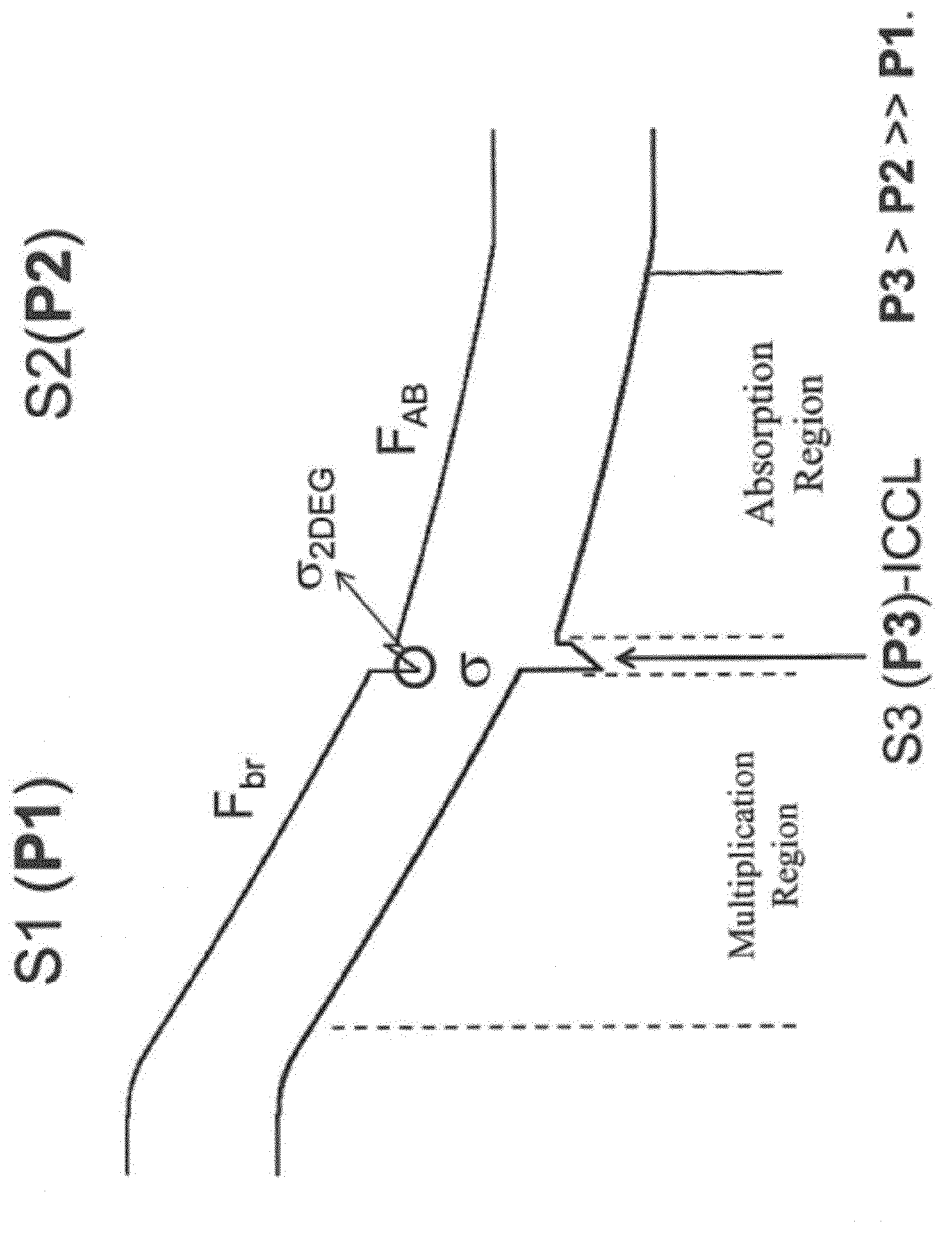
FIG. 9 illustrates graphically an energy band diagram for a PE-SAM APD employing an ICCL having polarization P3 greater than the polarization of the absorption layer P2 that is substantially greater than the polarization of the multiplication layer P1. The inclusion of the ICCL with P3 creates a dipole that induces a two dimensional electron gas $\sigma_{2DEG}$ at the interface that compensates the positive interface charge such that $F_{br}>(\sigma-\sigma_{2DEG})/\epsilon\epsilon_o$ and $F_{AB}>0$

An alternative approach for achieving $F_{AB}>0$ for the case where P2 is substantially greater than P1 such that $F_{br}<\sigma/\in\in_0$ prior to breakdown of the multiplication layer is illustrated in FIG. 9. FIG. 9 illustrates graphically an energy band diagram for a preferred embodiment PE-SAM APD under reverse bias and comprised of a multiplication layer composed of semiconductor 51 having polarization P1, an absorption region composed of a semiconductor S2 and having polarization P2 substantially greater than P1, and an ICCL composed of semiconductor S3 and polarization P3 greater than P2. In the embodiment depicted in FIG. 9, the inclusion of the ICCL with P3 greater than or graded to P2, creates a dipole that induces a two dimensional electron gas $\sigma_{2DEG}$ at the interface that compensates the positive interface charge $\sigma$ such that $\sigma_{net}=\sigma-\sigma_{2DEG}$ and $F_{br}>\sigma_{net})/\in\in_0$, and $F_{AB}>0$.

This ICCL feature facilitates tailoring the electric field profile of the device to ensure a sharp transition between the high electric field desired in the multiplication layer to ensure large gain and the low (but non-zero) electric field desired in the absorption layer to efficiently collect photogenerated carriers while substantially reducing the voltage penalty associated with employing a charge layer.

Figure 10:
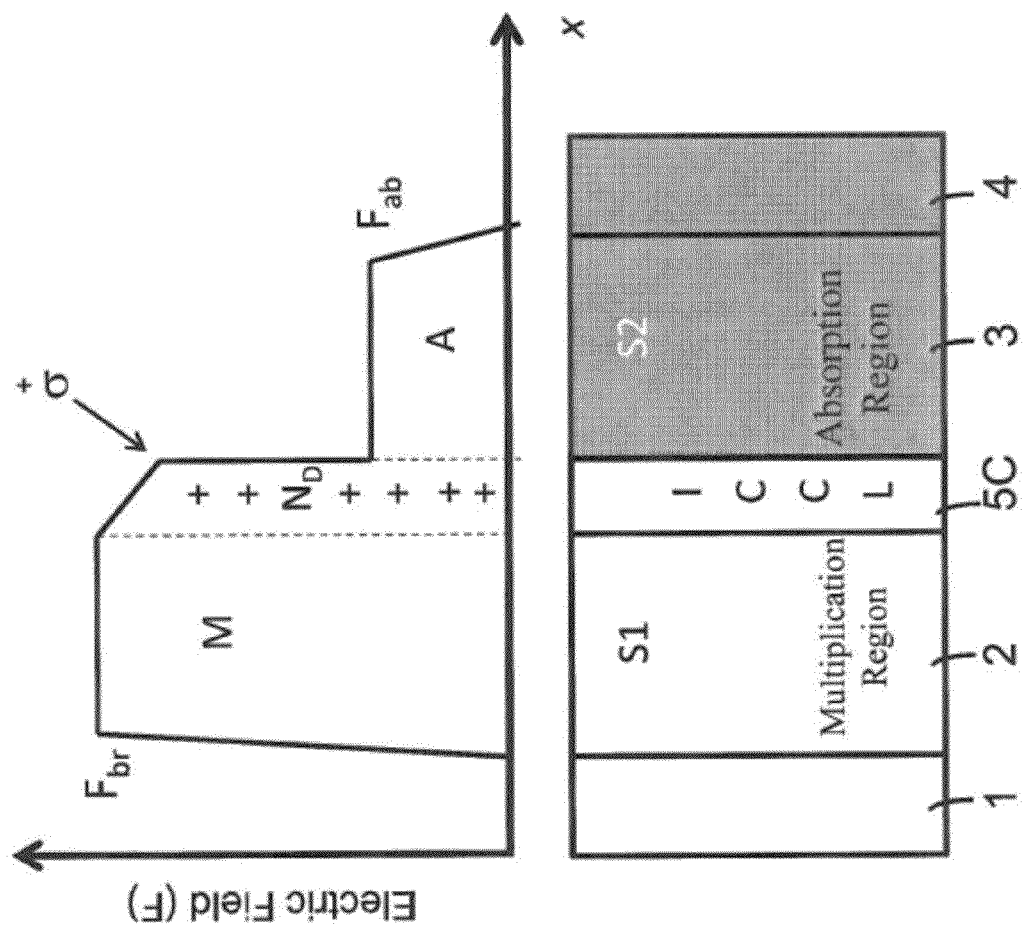
FIG. 10 illustrates graphically the electric field profile for a PE-SAM APD where the interface charge $\sigma$ is sufficiently small, so that the field in the absorption region will increase while the field in the multiplication region will decrease; whereupon the optimal field profile can be regained by adding an n-type charge layer to the multiplication region material at the heterointerface.

However, if the interface charge a is too small, the electric field in the absorption layer will increase while the field in the multiplication layer will decrease. This case is non-optimal as it can lead to a voltage penalty for achieving desired gain and a high dark current associated with the early breakdown of the absorption layer. FIG. 10 illustrates graphically the case where the interface charge a is too small, for which the field in the absorption region will increase while the field in the multiplication region will decrease; whereupon a more optimal field profile can be regained by introducing n-type charge layer to the multiplication region material at the hetero-interface (FIG. 10).

Figure 11:
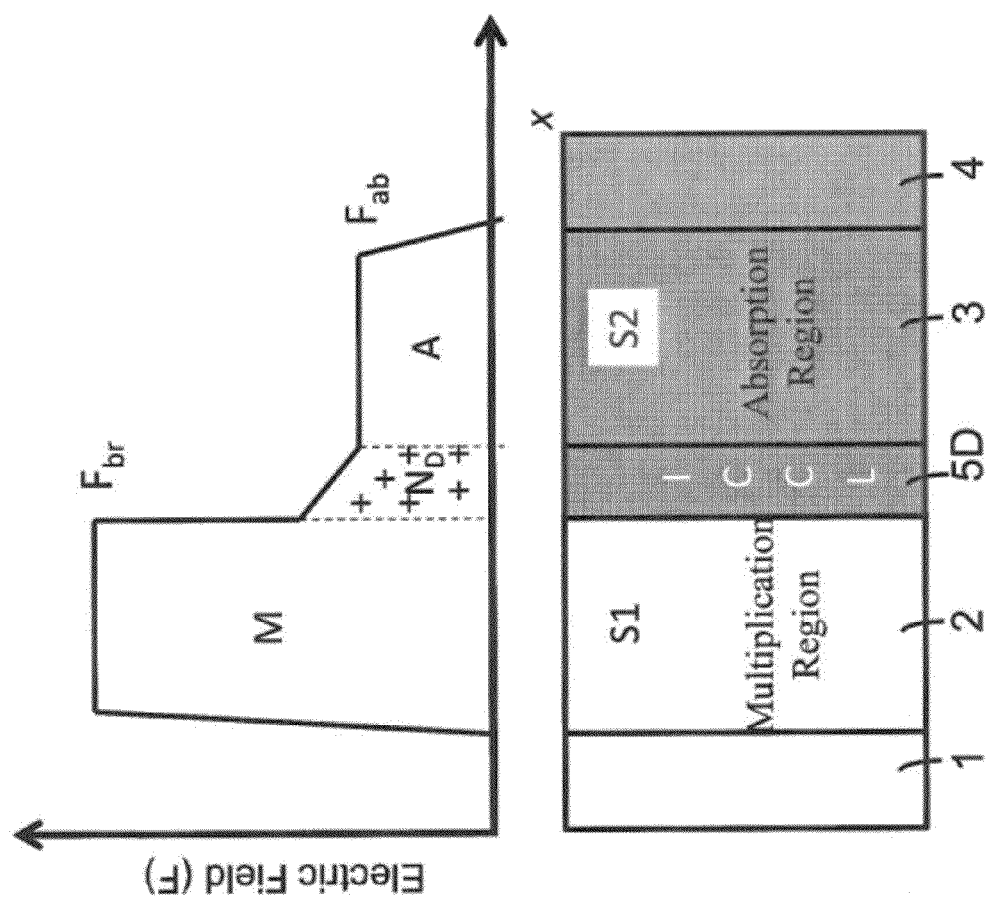
FIG. 11 illustrates graphically the presence of an interface charge control layer ICCL for the case where the interface charge a is too small, for which the field in the absorption region increases while the field in the multiplication region will decrease; whereupon the optimal field profile can be regained by adding an n-type charge layer to the absorption region material at the heterointerface.

FIG. 11 illustrates graphically the presence of an interface charge control layer (ICCL) for the case where the interface charge $\sigma$ is too small; whereupon the optimal field profile can be regained by adding an n-type charge layer to the absorption region material at the hetero-interface.

The charge layers illustrated by the preferred embodiments shown in FIGS. 10 and 11, are similar to those employed in separate absorption, charge, and multiplication (SACM) avalanche photodiodes (APDs) described in the literature. However, the presence of polarization induce charge at the hetero-interface between the multiplication layer 2 and the ICCL 5C significantly reduces the thickness of n-type material required to attain the additional positive charge via n-type doping resulting in a concomitant reduction of the voltage penalty associated with using a conventional charge layer.

The preferred embodiments of the present invention previously detailed in this document specifically discusses the case for a p-side down structure with II- or III-polar material (FIG. 12A), where the direction of vectors P1 and P2 are from multiplication layer towards the absorption layer and magnitude P2 is greater than the magnitude of P1 (P2>P1). However a number of additional important possibilities exist as follows.

For the case of a p-side down structure with V- or VI-polar material (FIG. 12B), the direction of vectors P1 and P2 are from absorption layer towards the multiplication layer and magnitude of P2 is now less than magnitude of P1 (|P2|<|P1|). Otherwise, this preferred embodiment of the present invention as detailed remains largely the same as previous embodiments.

For the case of an n-side down structure with V- or VI-polar material, a p-type absorption region would be employed to inject electrons into the multiplication region. For this case, the direction of vector P1 and P2 are from absorption layer towards the multiplication layer and magnitude of P2 is now greater than magnitude of P1 (|P2|>|P1|). The polarization interface charge is negative. Otherwise, this preferred embodiment of the invention as detailed remains largely the same as previously described embodiments.

For the case of an n-side down structure with II- or III-polar material, a p-type absorption region would be employed to inject electrons into the multiplication region. In this case, the direction of vectors P1 and P2 are from multiplication layer towards the absorption layer and magnitude P2 is now less than the magnitude of P1 (|P2|<|P1|). and the polarization interface charge is negative. Otherwise, this preferred embodiment of the invention as detailed remains largely the same as previously described embodiments.

While the band diagrams in FIGS. 5,6,9 depict a semiconductor 51 in the multiplication region that has a narrower band gap than and type-II alignment with the semiconductor S2, the approaches of the current invention do not in general have either a specific band alignment between S1 and S2 and/or 51 having a larger band gap than S2.

While the electric field profiles in FIGS. 7,8,10,11 illustrate the electric field distribution in a PE-SAM-APD where the magnitude of the field in the multiplication layer is at breakdown $F_{br}$, it is well understood that these devices may be operated under reverse bias before breakdown in the multiplication layer.

SiC APDs have been demonstrated and state of the art devices can have high quantum efficiency (QE) in the deep ultraviolet (~60% @ 268 nm), high gain, low dark current density ($J_{dark}$=64 nA/cm$^2$ at a gain of 1000, which indicates primary dark current of <10 fA), and low noise (k=0.10) (as described further in M. Liu, et al. "Low dark count rate and high single-photon detection efficiency avalanche photodiode in Geiger-mode operation," *IEEE Phot. Tech. Lett.* 19, 378-80, (2007), hereby incorporated by reference). However, the indirect band gap of SiC results in poor absorption and therefore reduced response near its band gap around 380 nm and no response in the visible. Therefore these devices are not suitable for light detection in the near ultraviolet and visible spectrum.

GaN APDs grown on bulk GaN substrates have been demonstrated that exhibit gains of ~1000 and dark current densities of ~2.6 µA/cm$^2$ near avalanche breakdown (as described by J. B. Limb et al., "GaN ultraviolet avalanche photodiodes with optical gain greater than 1000 grown on GaN substrates by metal-organic chemical vapor deposition" *Appl. Phys. Lett* 89, 011112 (2006), hereby incorporated by reference). However, the size of these devices is still smaller than those of SiC APDs, 30-50 µm in diameter as compared to 250 µm, presumably due to the presence of defects. Furthermore, the noise in GaN APDs is likely to be significantly higher than that of SiC APDs due to the near unity ratio of the ionization coefficients in GaN (k~1), with these devices therefore requiring structures employing impact ionization engineering.

Figure 12:
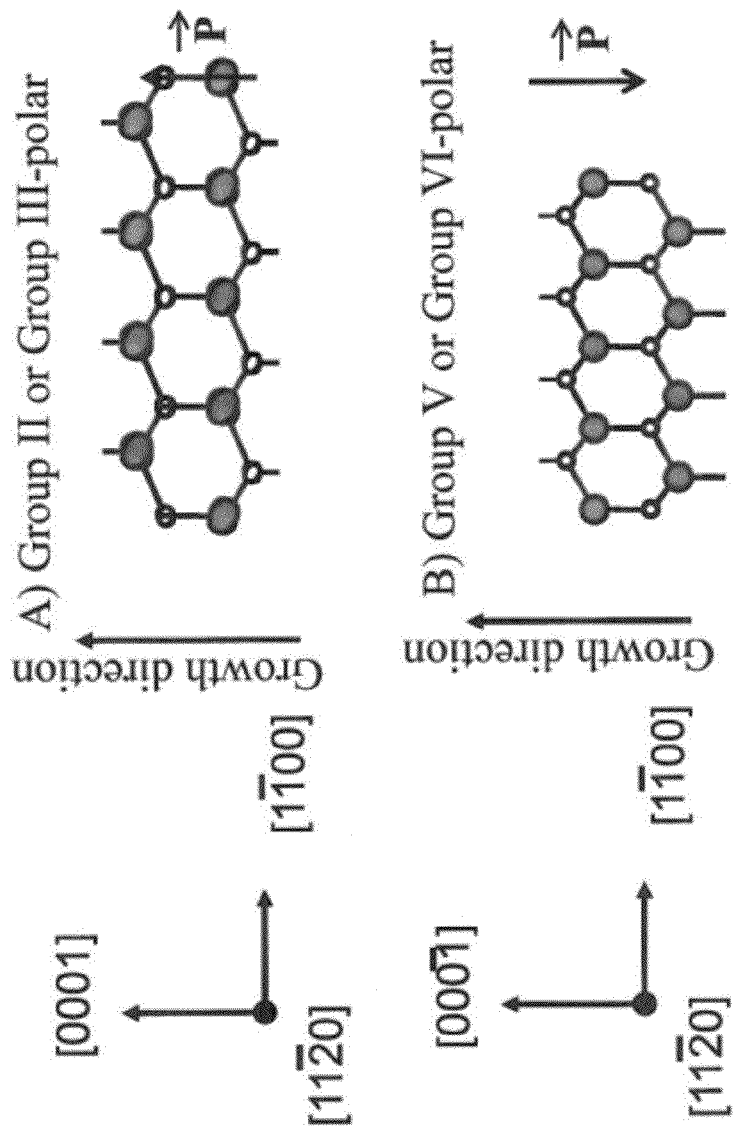
FIG. 12 illustrates exemplary Wurtzite structure for III-V and II-VI polar semiconductors.
Figure 13:
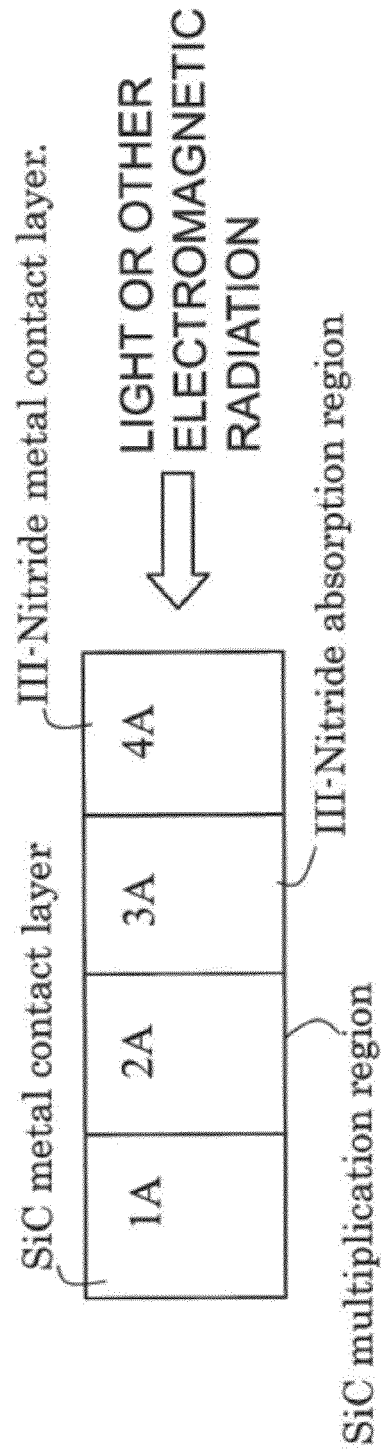
FIG. 13 is a schematic illustration of a III-Nitride/SiC PE-SAM-APD.

As shown schematically in FIG. 13, an exemplary preferred embodiment polarization enhanced (PE) Separated Absorption Multiplication (SAM) Avalanche PhotoDiode (APD) (a III-Nitride/SiC PE-SAM APD) comprising a (0001) oriented (III-polar), wurtzite, III-Nitride semiconductor absorption layer 3A having large spontaneous polarization and a (0001) oriented SiC multiplication layer 2A having less polarization 2. FIG. 12 illustrates exemplary wurtzite structure for III-V and II-VI polar semiconductors.

The preferred embodiment provides the possibility of fabricating APDs having low dark current and high sensitivity comparable to that of SiC APDs by employing SiC for the multiplication layer 2A, while providing the capability of improving the quantum efficiency of the detector over a widely tunable spectral range from ~200 to 1907 nm, by using a direct band gap of the III-Nitride alloy in the absorption layer 2A. These APDs would be operable in a single photon counting Geiger mode that makes them suitable as a replacement for the commonly employed photomultiplier tube photodetector in a large number of applications.

Figure 14:
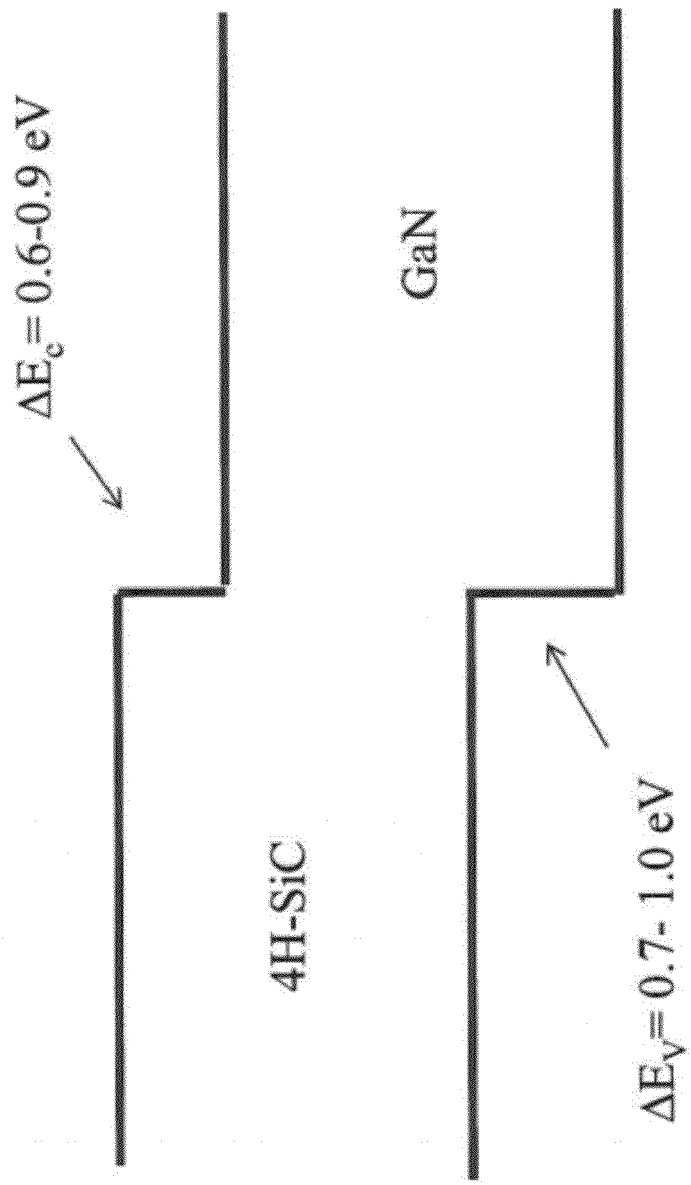
FIG. 14 is an illustration of an energy band diagram showing the band alignment between GaN and 4H—SiC layers.

In addition to the advantages associated with polarization, this specific detector can benefit from the formation of a type II heterojunction between the III-Nitride and 4H SiC layers with both the conduction and valence band energies of the GaN below those of the SiC for certain III-Nitride alloy compositions. FIG. 14 is an illustration of the energy band diagram between GaN and 4H—SiC layers. It should be noted that the specific embodiment of GaN/4H—SiC shown in FIG. 14 has a highly desirable band alignment. The conduction band offset is between −0.6 and −0.9 eV, while the valence band offset is between 0.7 and 1 eV. For further details, see Danielsson, E., C.-M. Zetterling, M. Ostling, K. Linthicum, D. B. Thomson, O.-H. Nam, and R. F. Davis, "The influence of band offsets on the IV characteristics for GaN/SiC heterojunctions", Sol. State Electron., Vol. 46, pp. 827-35, (2002) (hereby incorporated by reference). This band alignment promotes hole injection and inhibits electron injection from GaN into SiC, in concert with the n-type (Al)(In)GaN absorption layers that will be employed to ensure single carrier injection of the photogenerated holes in the absorption layer into the SiC multiplication layer. This single carrier injection is optimum since the hole ionization coefficient of SiC is much greater than that of the electron. Moreover, pure hole injection may result in even lower noise than has previously been achieved with homojunction SiC APDs due to the expected lower k factor. While k factors as low as 0.02, comparable to that of the best Si APDs, have been projected for SiC APDs (as discussed further in Konstantinov, A. O., Q. Wahab, N. Nordell and U. Lindefelt, "Ionization rates and critical fields in 4H silicon carbide", Appl. Phys. Lett., Vol. 71, no. 1, pp. 90-92, 1997, hereby incorporated by reference), such results have not been achieved to date, probably due to the fact that in the homojunction SiC APDs much of the light is absorbed in the multiplication layer. This is equivalent to mixed injection, which results in higher excess noise, i.e., higher effective k factors. Since the III-Nitride/SiC PE-SAM-APD will result in pure hole injection, lower excess noise, comparable to Si, is expected.

It should be noted that while the specific case of a III-Nitride/SiC PE-SAM APD has this beneficial type II energy band alignment between the III-Nitride absorption region and the SiC multiplication region, in general a polarization enhanced SAM APD need not have this band alignment.

As shown in FIG. 2, this preferred embodiment device has the significant advantage that the interface charge enables a very sharp transition between the high electric field desired in the multiplication layer to ensure large gain and the low electric field desired in the absorption layer to efficiently collect photogenerated carriers. As a result, this structure does not require a charge layer, and the significant voltage penalty associated with a charge layer, commonly employed in a separate absorption, charge and multiplication avalanche photodiode (SACM-APD), to control the transition of the electric field from the multiplication to the absorption region (see FIG. 2 top).

Figure 15:
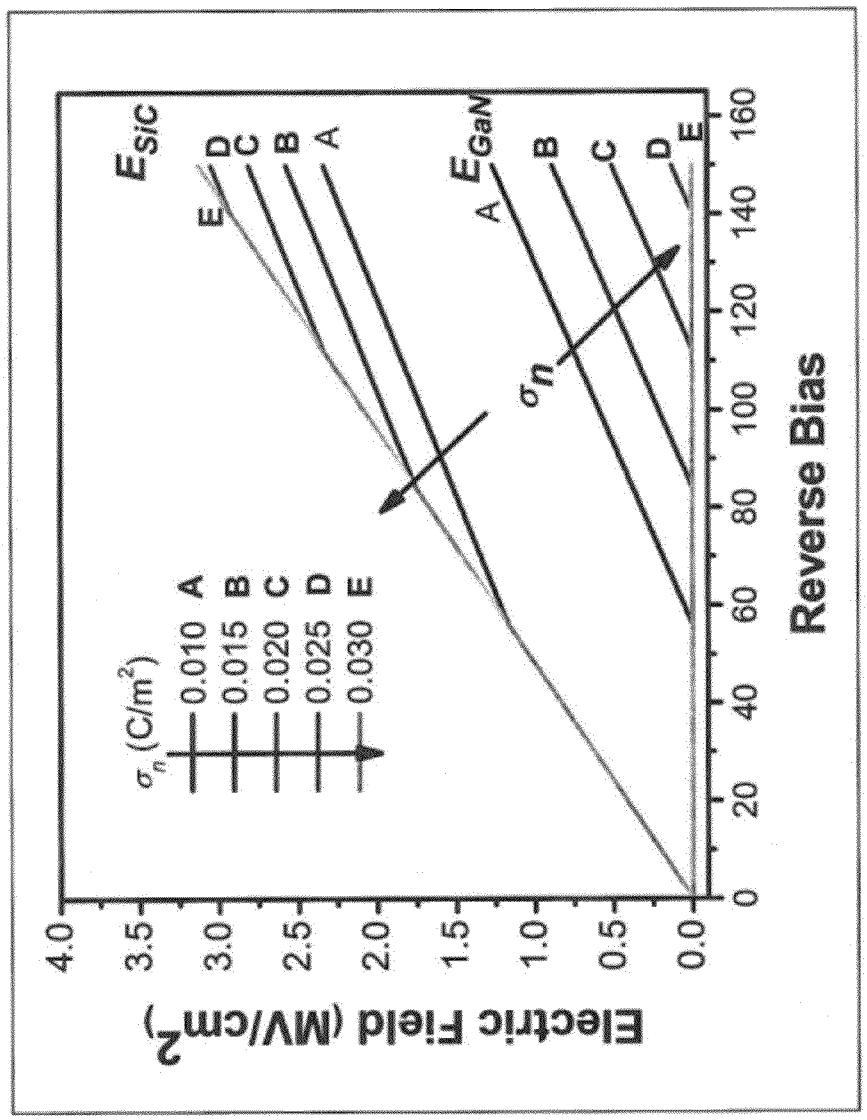
FIG. 15 is a calculation of the electric field distribution between the absorption and multiplication layers in a III-Nitride/SiC PE-SAM-APD as a function of applied reverse bias for a number of magnitudes of net interface charge $\sigma_{net}$.

Controlling the density of interface charge is critical to the performance of a III-Nitride/SiC PE-SAM APD that contain defects at the hetero-interface between III-Nitride absorption layer and the SiC multiplication layer. FIG. 15 shows the calculated electric field distribution between the GaN absorption layer and the SiC multiplication layer as a function of reversed bias for a number of magnitudes of net interface charge density $\sigma_{net}$. Letters A-E are provided to guide the reader to the appropriate companion curves for a given magnitude of $\sigma_{net}$. As demonstrated in FIG. 15, at small reverse bias, the electric field in the device structure is confined entirely within the SiC layer. When the applied bias satisfies the condition $F_{SiC} > \sigma/\epsilon\epsilon_0$, punch-though occurs and $F_{GaN} \neq 0$. It is clear from FIG. 15 that increasing interface charge, $\sigma_{net}$ increases the bias required to achieve punch-through. However the critical field in the SiC multiplication region ($F_{SiC}^{cr}$), beyond which avalanche breakdown occurs, places an upper limit on the reverse bias that may be applied. As a result, substantially large interface charge makes it impossible to extend the electric field to the GaN region prior to avalanche breakdown within the SiC multiplication region.

This can result in reducing the quantum efficiency (QE) of the detector by limiting charge collection from the absorption to the multiplication layer to primarily a diffusion mechanism in the presence of a large density of defects at the hetero-interface; these defects introduce traps states at the interface that reduces the effective diffusion length of photo generated holes inhibiting their collection. Such defects can arise during the heteroepitaxial growth of III-Nitride films on SiC substrates due to lattice mismatch between these materials as well as the presence of surface contamination on the SiC substrate.

In contrast, insufficient charge will lead to excessive electric field in the absorption $$\begin{cases} 0 < F_{GaN} < F_{GaN}^{br} \\ F_{SiC} \approx F_{SiC}^{cr} \end{cases}$$

layer, resulting in increased injection of background carriers from this layer to the multiplication layer, and therefore higher dark current. For an optimized device, the electric field in the SiC multiplication region should approach but not exceed $F_{SiC}^{cr}$, while the electric field in the GaN absorption region should be non-zero, but less than the breakdown field for GaN ($F_{GaN}^{br}$), i.e., This requirement defines the optimal magnitude of interface charge as:

It is important to note that $F_{GaN}^{br} \ll F_{SiC}^{cr}$ in heteroepitaxially grown GaN due to the presence of a large dislocation density at the hetero-interface that has been demonstrated to give rise to large leakage currents at low reverse bias in GaN p-n junction diodes. As a result, $$\epsilon_{SiC} F_{SiC}^{cr} - \epsilon_{GaN} F_{GaN}^{br} < \sigma_n < \epsilon_{SiC} F_{SiC}^{cr}$$

the parameter space for optimal interface charge density, so that the detector can have both high QE and low dark current, is narrower in this case.

Furthermore, it is important to note that the quantum efficiency of a III-Nitride/SiC PE-SAM-APD free of hetero-interface defects will likely not depend strongly on the magnitude of interface charge and the electric field in the III-Nitride absorption region.

Figure 16:
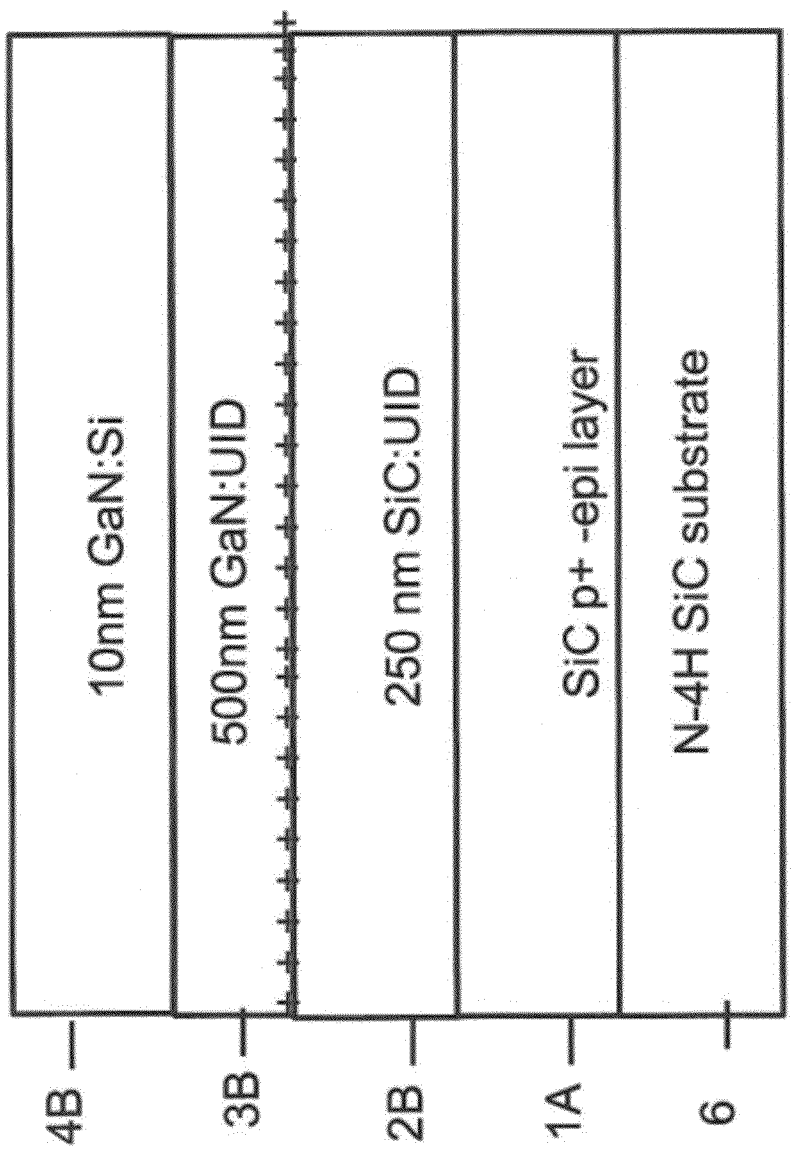
FIG. 16 is an illustration of the structure of a fabricated GaN/SiC PE-SAM-APD.

FIG. 16 is a schematic illustration of a preferred embodiment fabricated device structure of a GaN/SiC PE-SAM-APDs comprising a 10 nm thick, silicon doped, n-type GaN layer 4B that assists in forming an electrical contact to the absorption region, a 500 nm thick GaN absorption layer 3B, a 250 nm thick SiC multiplication layer 2B, and a SiC p+ layer 1A and a n-4H SiC substrate 6. A positive polarization induced charge is created at the interface between layer 2B and layer 3B due to the larger polarization of GaN (~0.034 C/m² as given by I, Vurgaftman et al. "Band Parameters for Nitrogen-containing Semiconductors". *J. Appl. Phys.* 2003, 94, 3675-96, hereby incorporated by reference) over SiC (0.011-0.021 C/m² given by S. Bai et al, "Determination of the Electric Field in 4H/3C/4H—SiC Quantum Wells Due to Spontaneous Polarization in the 4H SiC Matrix". *Appl. Phys. Lett.* 2003, 83, 3171-3173. Hereby incorporated by reference). It is noted that layers 2B, 3B and 4B are deposited epitaxially upon the commercially purchased SiC structure, 1A, 6, by molecular beam epitaxy. However, any epitaxial deposition technique or combination of techniques including but not limited to metal organic chemical vapor deposition (MOCVD), hydride vapor phase epitaxy (HVPE), liquid phase epitaxy (LPE), metal organic vapor phase epitaxy (MOVPE) can be employed to manufacture the PE-SAM APD.

Figure 17:
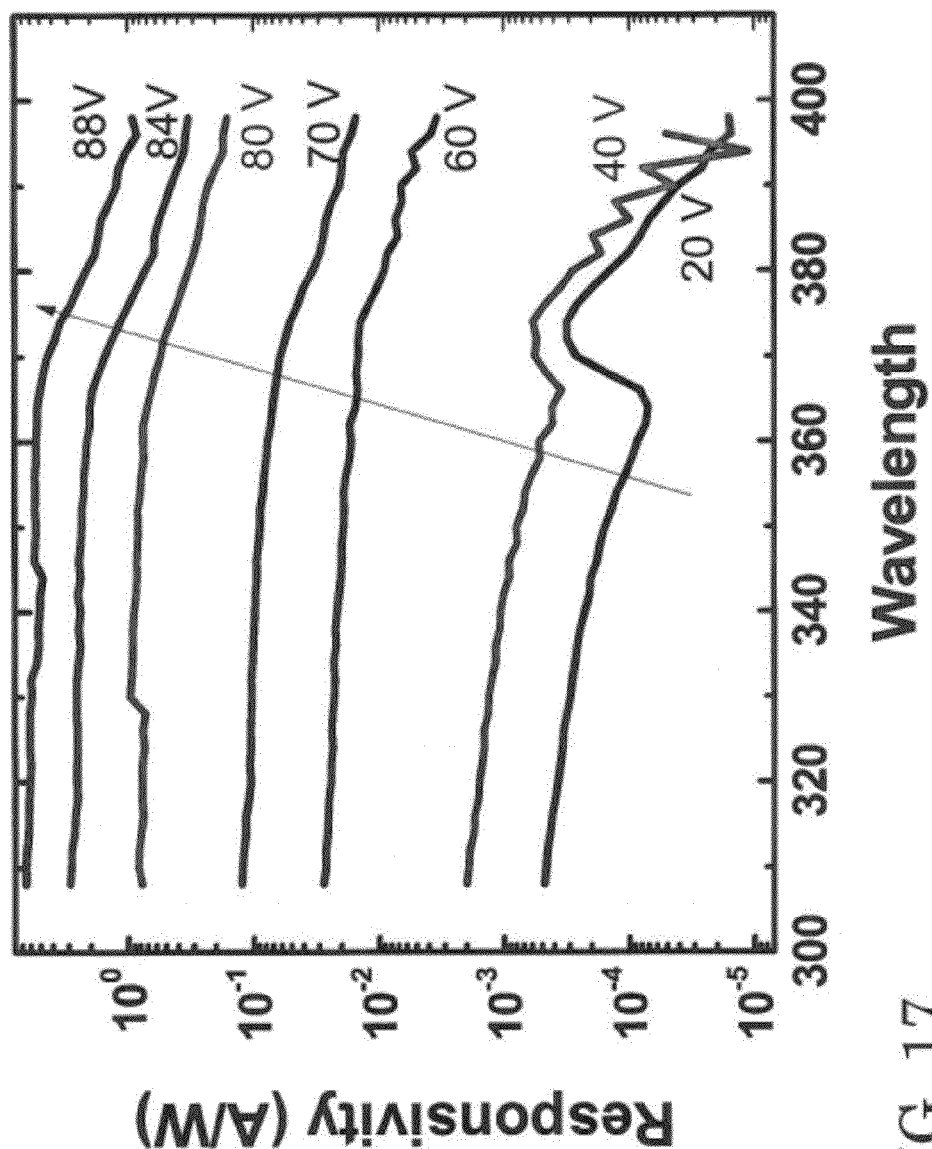
FIG. 17 is a graph of the measured photoresponse from a fabricated GaN/SiC PE-SAM-APD for various magnitudes of reverse bias.
Figure 18:
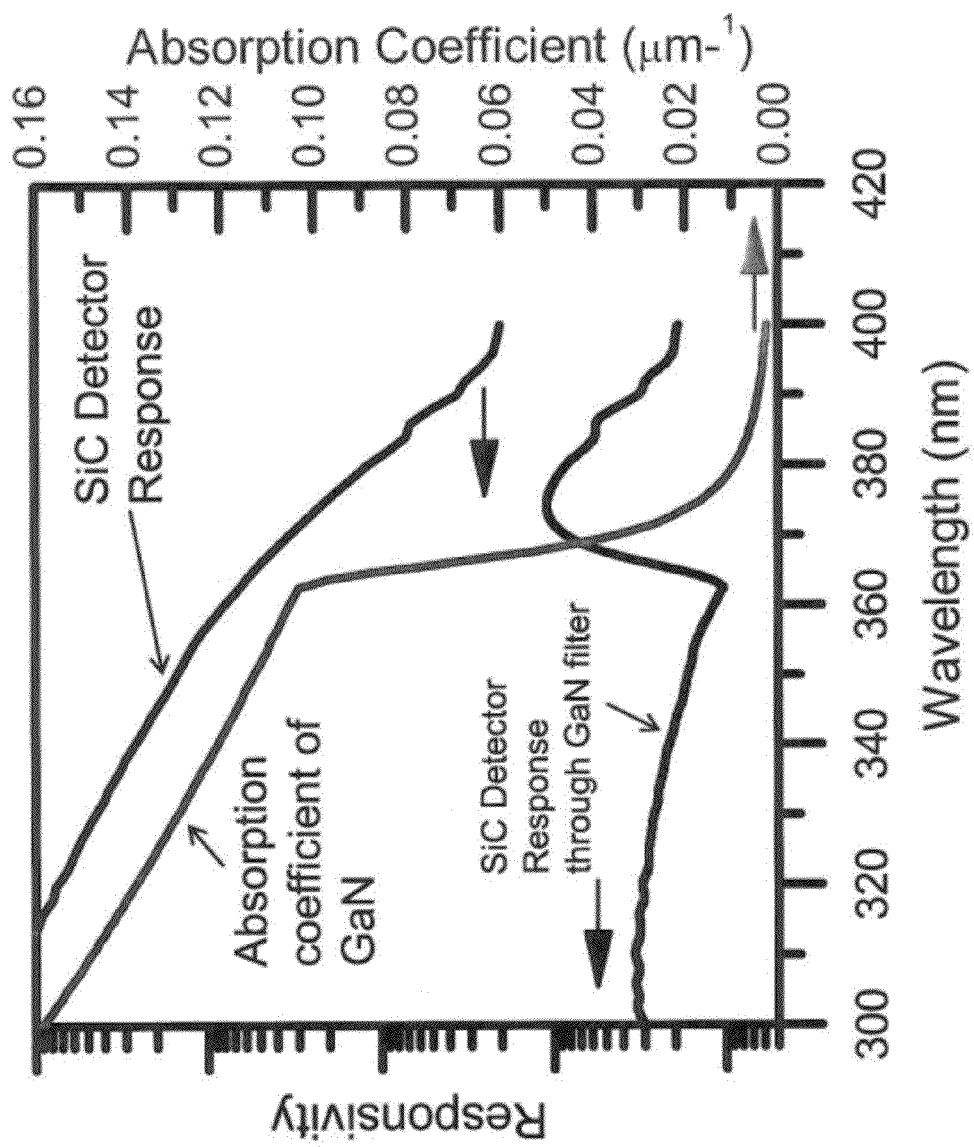
FIG. 18 is graph demonstrating the shape of the spectral response expected for a SiC detector through a GaN optical filter (black curve) using the measured response of a SiC detector (dark gray curve) and the theoretical absorption coefficient of GaN (light gray curve).

FIG. 17 is a graphical illustration of the responsivity of GaN/SiC APD at various magnitudes of applied reverse bias (20-88V). The observed photoresponse is dominated by the collection of holes photogenerated in the GaN absorption layer and collected by the SiC multiplication region for applied bias greater than 40V. For applied bias of 40V and below, the shape of the response is not consistent with the collection of holes generated in the GaN absorption layer. Rather this response is likely related to photogenerated carriers created by the absorption of light directly in the SiC multiplication layer with the GaN absorption layer acting as an optical filter. This is supported by the calculation of the photoresponse of a SiC photodetector through a GaN optical filter illustrated by the black curve in FIG. 18. This was calculated using the measured photoresponse of a SiC photodetectors given by the dark grey curve and the theoretical absorption coefficient for GaN given by the light gray curve in FIG. 18. This is attributed to the negligible magnitude of the electric field in the GaN absorption region in this detector at low reverse bias due to the presence of positive polarization interface charge. At higher applied bias, the electric field in the SiC multiplication layer meets the condition $F_{SiC} > \sigma/\epsilon\epsilon_0$ and is sufficient to allow punch-through of the electric field into the GaN absorption layer. As a result, holes photogenerated within this layer are more efficiently swept into the multiplication layer due to the electric field in the absorption layer and the response of the detector is dominated by the GaN absorption layer.

Figure 19:
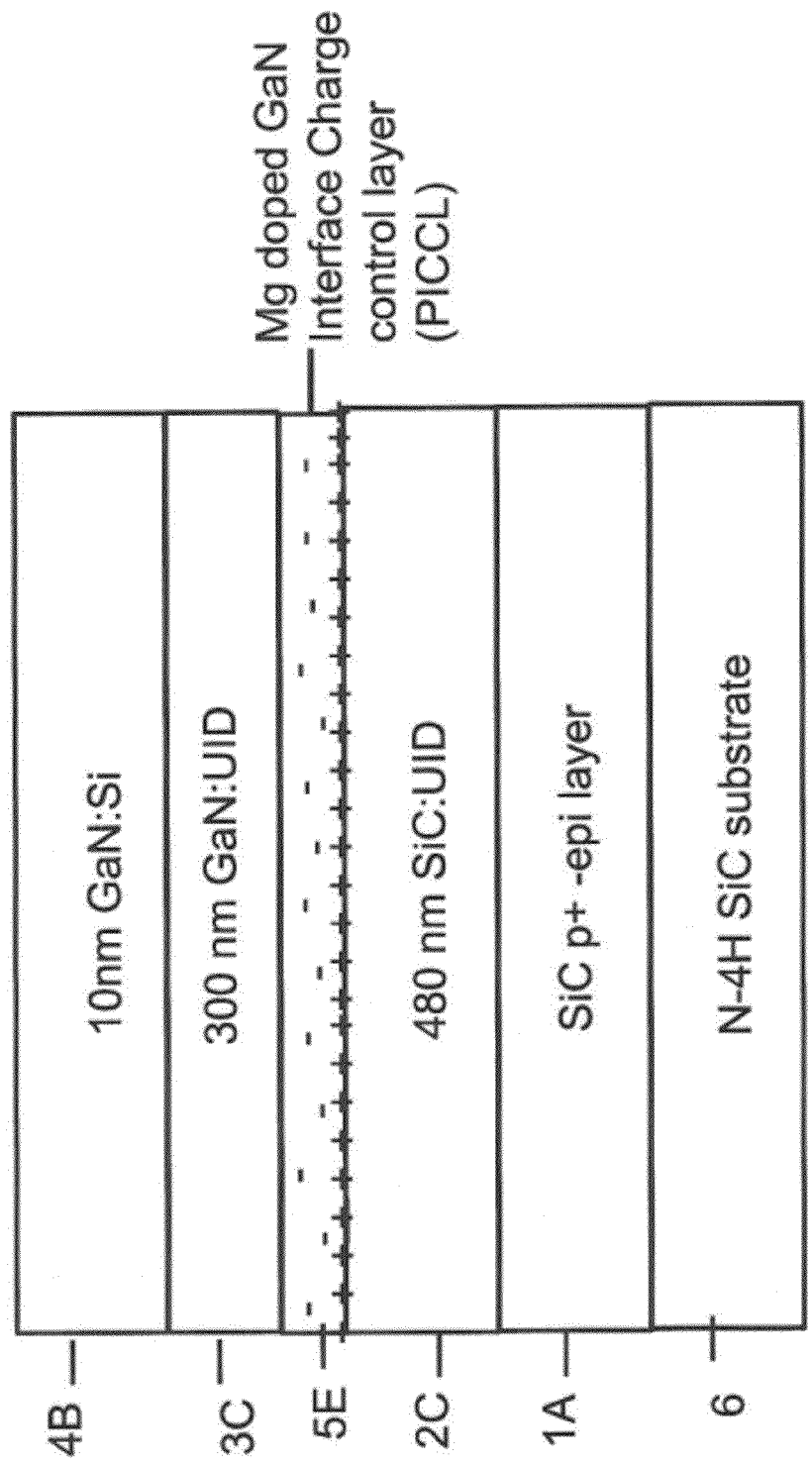
FIG. 19 is an illustration of the structure of a fabricated GaN/SiC PE-SAM-APD employing a p-type interface charge control layer (PICCL).

FIG. 19 is a schematic illustration of a preferred embodiment fabricated device structure of a GaN/SiC PE-SAM-APDs incorporating a p-type interface charge control layer (PICCL). A 10 nm thick, silicon doped, n-type GaN layer 4B of an approximate thickness of 10 nanometers operates as a layer that assists in forming an electrical contact to the absorption region. The preferred embodiment of FIG. 16 further comprises a 300 nm thick GaN absorption layer 12, a 480 nm thick SiC multiplication layer 2C, and a SiC p+ layer 1A and a n-4H SiC substrate 6. The preferred embodiment further comprises a delta doped p-type GaN interface charge control layer 5E, doped with Mg atoms, between layer 2C and layer 3C. A positive polarization induced charge is created at the interface between layer 2C and layer 5E due to the larger polarization of GaN over SiC. The ionized acceptors in the delta doped PICCL results in negative charge localized near the interface between layer 5E and 2C due to the narrow thickness of layer 5E. It is noted that layers 2C, 3C, 4B, 5E are deposited epitaxially upon the commercially purchased SiC structure, 1A, 6, by molecular beam epitaxy. However, any epitaxial deposition technique or combination of techniques including but not limited to metal organic chemical vapor deposition (MOCVD), hydride vapor phase epitaxy (HVPE), liquid phase epitaxy (LPE), metal organic vapor phase epitaxy (MOVPE) can be employed to manufacture the PE-SAM APD.

Figure 20A:
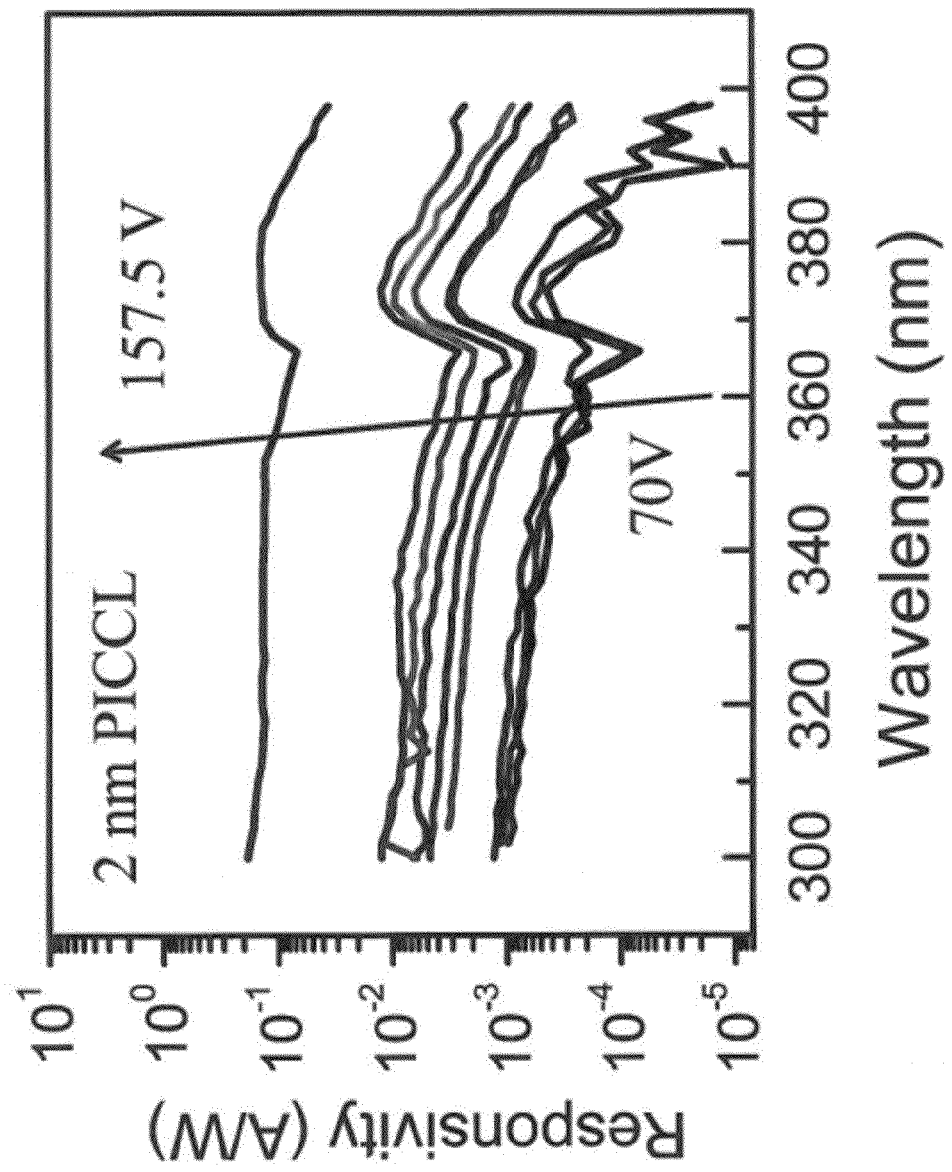
FIG. 20 is a graph of the measured photoresponse for various magnitudes of applied bias for GaN/SiC PE-SAM-APD employing a p-type interface charge control layer (PICCL) having a thickness of 2 nm (FIG. 20A), 10 nm (FIG. 20B) and 15 nm (FIG. 20C).
Figure 20B:
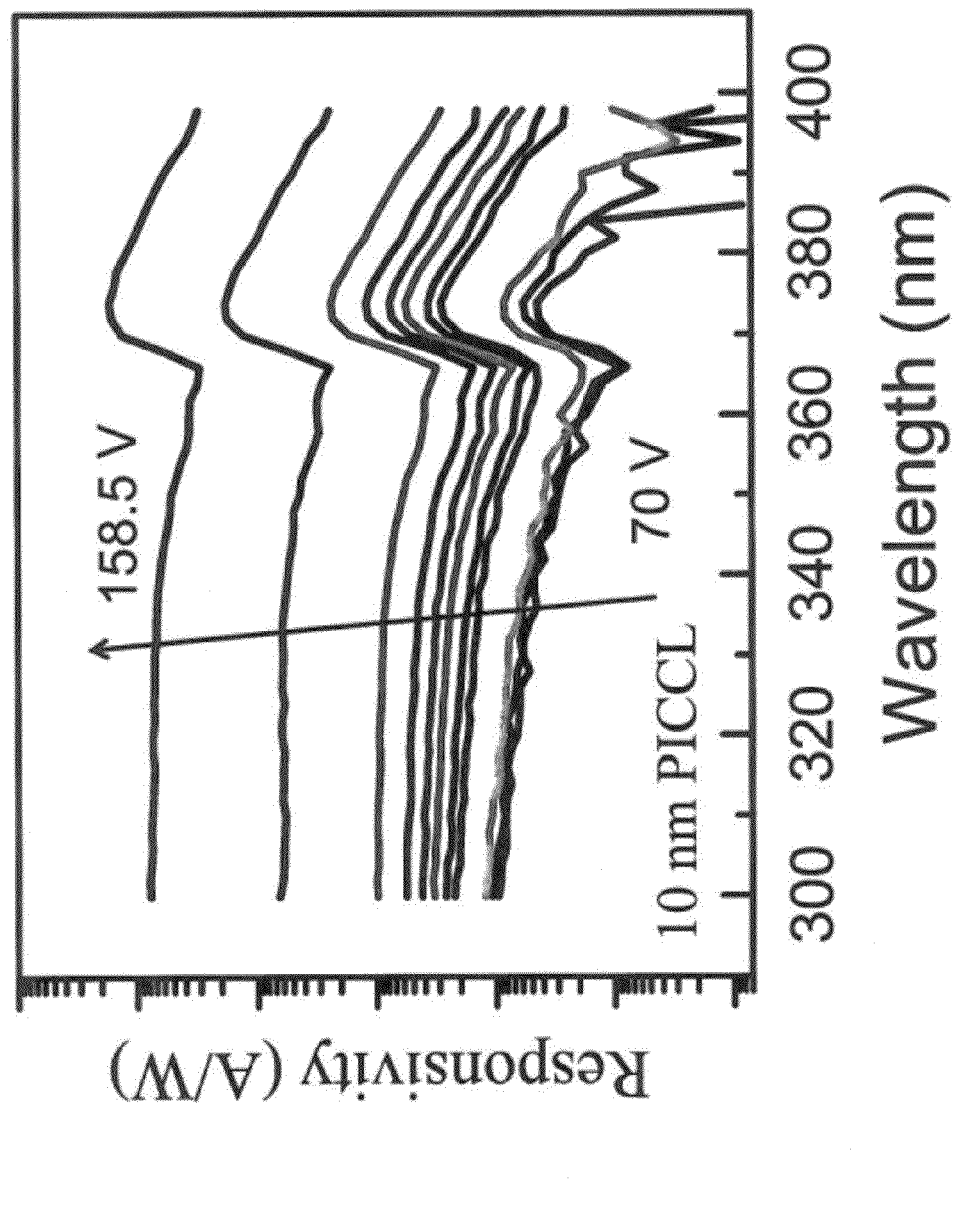
Figure 20C:
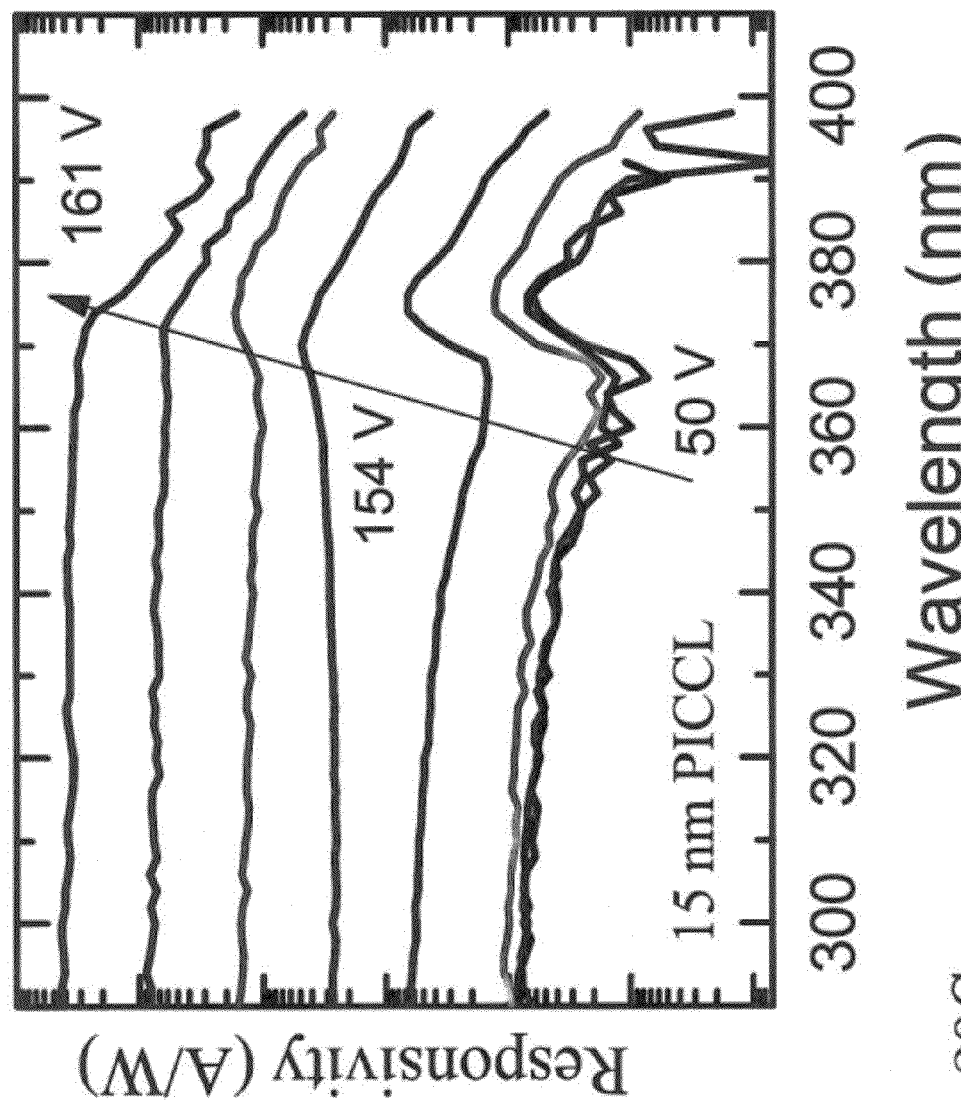

FIG. 20 is a graphical illustration of the measured responsivity for three GaN/SiC PE-SAM-APDS having PICCLs with thickness of 2 nm (FIG. 20A), 10 nm (FIG. 20B) and 15 nm (FIG. 20C) at various magnitudes of applied reverse bias. All devices exhibit photoresponse dominated by photogenerated carriers created directly in the SiC multiplication region for applied reverse bias below 154V. This is attributed to the confinement of electric field to the SiC multiplication layer ($F_{GaN}$~0) due to the net interface charge $\sigma_{net}$ (positive polarization charge reduced by negative ionized acceptor charge in PICCL) at the GaN/SiC interface.

For the GaN/SiC PE-SAM APDs having PICCLs with thickness of 2 and 10 nm, GaN response was not achievable by increasing the applied reverse bias before the SiC multiplication layer brokedown; This is attributed to the fact that $F_{SiC} < \sigma_{net}/\in\in_0$.

However, the photoresponse of the GaN/SiC PE-SAM APD having a PICCL with thickness of 15 nm is dominated by the collection of holes photogenerated in the GaN absorption region. This result indicates that the net interface charge $\sigma_{net}$ is sufficiently reduced for this case (FIG. 20C) to allow for punchthrough of the electric field into the GaN absorption layer. In other words, for the case of a GaN/SiC PE-SAM APD having a 15 nm PICCL, $F_{SiC} > \sigma_{net}/\in\in_0$ so that $F_{GaN} > 0$.

Figure 21:
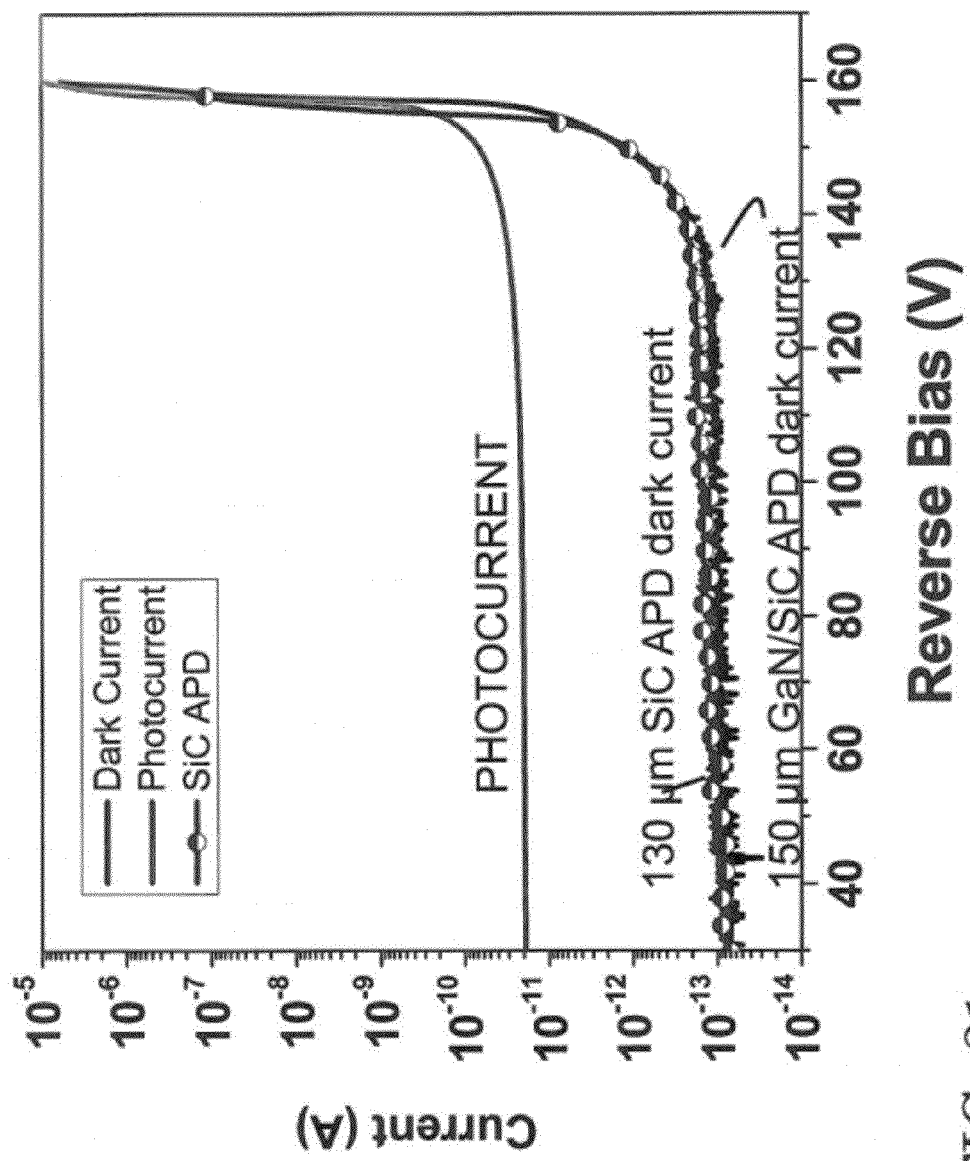
FIG. 21 illustrates the dark current (black), photocurrent (grey) and for a 150 micron diameter GaN/SiC PE-SAM-APD. For comparison the dark current for a 130 micron diameter SiC APD (grey, half open circles) is provided.

FIG. 21 illustrates the dark current (black) and photocurrent (grey) for a 150 μm diameter GaN/SiC PE-SAM-APD and the dark current for a 130 μm diameter SiC APD (grey, half filled circles). These APDs exhibit dark currents as low as 0.1 nA near breakdown that is similar to what is observed for comparable SiC APDs. This result suggests that the reverse leakage currents in these devices are limited by the SiC multiplication layer despite the presence of defects at the heterointerface between the GaN and SiC. It is also important to note that the dark current in these devices is ~1000 times lower than what has been observed for GaN APDs despite having areas that are ~25 times larger.

Figure 22:
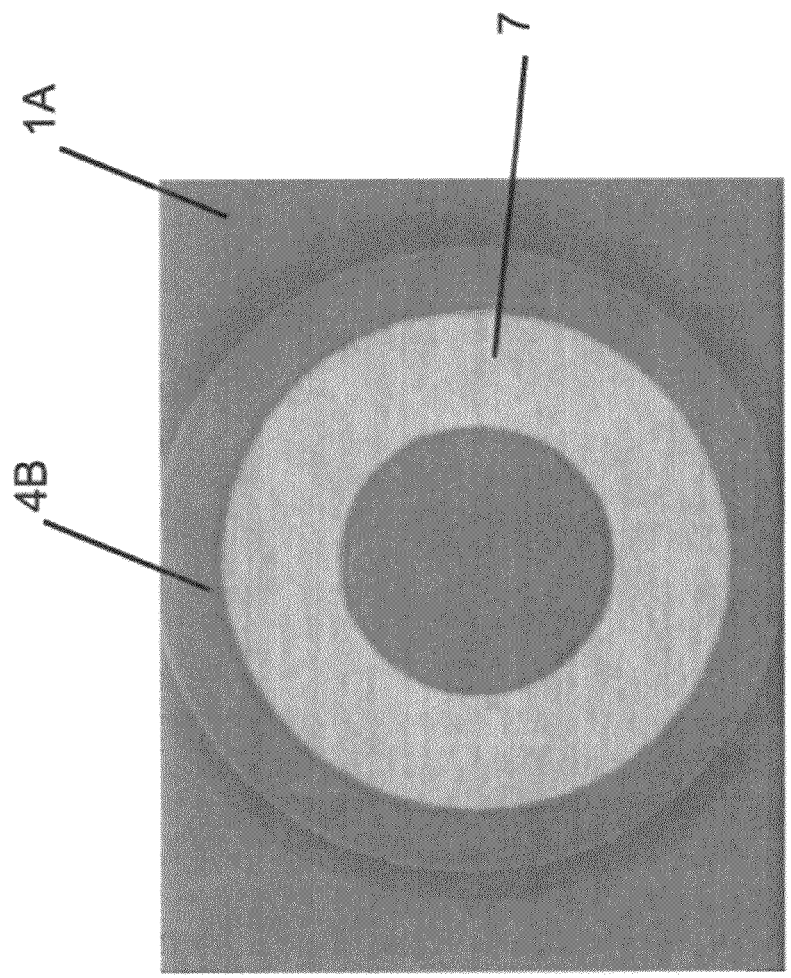
FIG. 22 is a scanning electron microscopy plan view image of a fabricated GaN/SiC PE-SAM-APD.

FIG. 22 presents a scanning electron microscopy plan view image of a fabricated GaN/SiC PE-SAM APD photodetector. The III-Nitride metal contact layer 4B, SiC metal contact layer 1A and the III-Nitride metal contact 7 are readily viewable.

Figure 23:
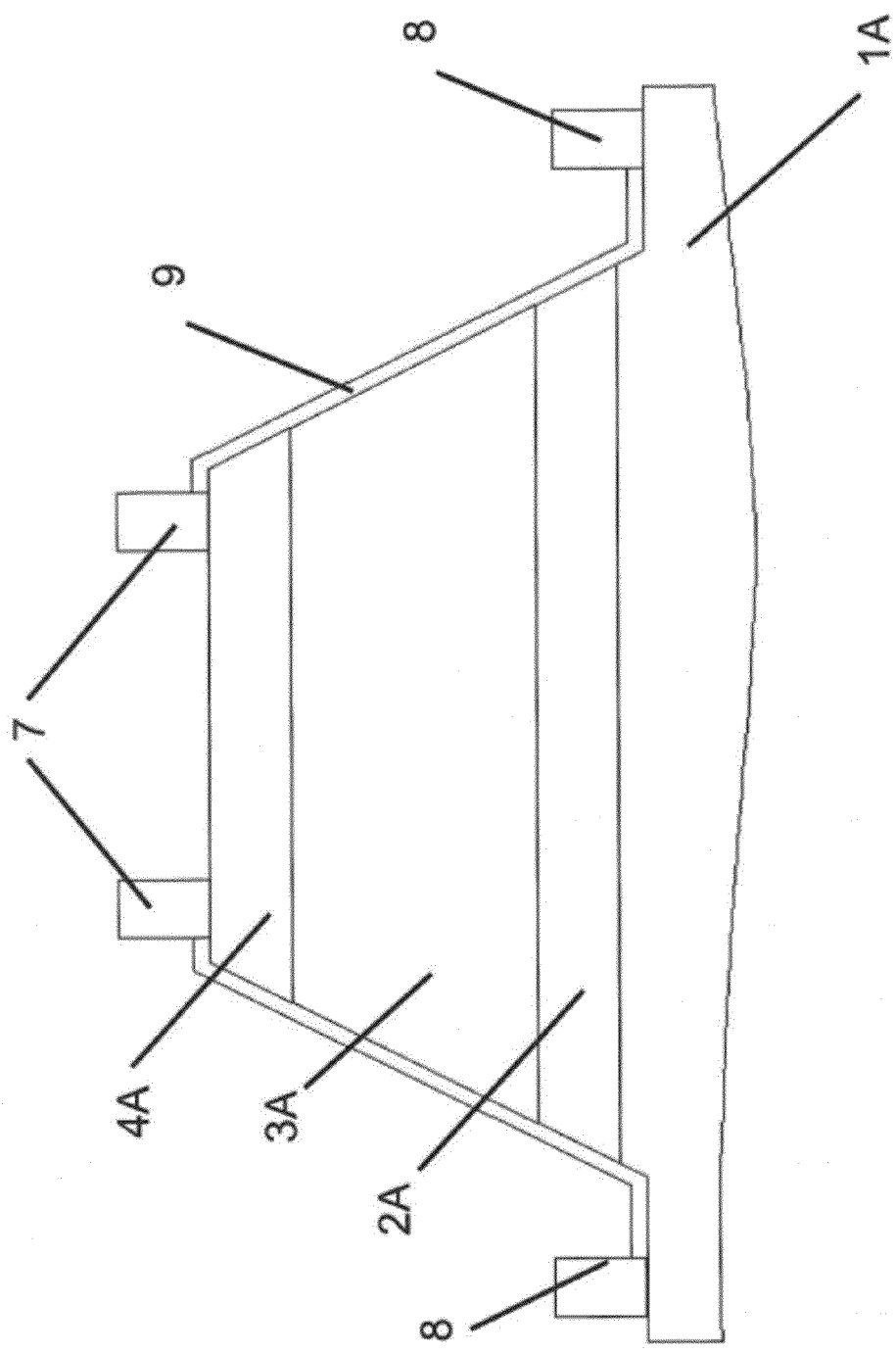
FIG. 23 is an illustration of the cross-sectional structure of a preferred embodiment fabricated GaN/SiC PE-SAM-APD.

FIG. 23 illustrates a schematic of a preferred embodiment fabricated III-Nitride/SiC PE-SAM/APD device structure comprising a SiC multiplication contact region or layer 1A, a SiC multiplication region or layer 2A, a III-Nitride semiconductor absorption region or layer 3A, and a III-Nitride semiconductor absorption metallic contact region or layer 4A. The device structure further comprises a III-Nitride n-type ohmic metal contact 7, a SiC p-type ohmic contact 8, and a side wall mesa passivation layer 9. This detector employs a preferable beveled mesa sidewall for reducing reverse leakage currents along the perimeter of the mesa.

In addition to the GaN/SiC PE-SAM APD employing a PICCL illustrated in FIG. 19 a number of other preferred embodiments exists that take advantage of the strain-state of the absorption, multiplication and interface charge control layers, as piezoelectric polarization charge can affect the total density of interface charge. For the case of a III-Nitride/SiC PE-SAM-APD, the sign of the piezoelectric charge produced by compressive strain is opposite to that of the spontaneous polarization charge, thus reducing the positive charge at the hetero-interface, while, conversely, tensile strain increases the density of positive interface charge. While the mechanical strain expected in thin GaN films on SiC is expected to be compressive due to the smaller a lattice constant of 4H—SiC (3.07 A) over GaN (3.18 A), in practice these films have a residual tensile strain. This result has been attributed to the larger thermal expansion coefficient of GaN ($5.59 \times 10^{-6}$/K) over that of SiC ($-4.20 \times 10^{-6}$/K) that causes tensile strain to build in the GaN film as it is cooled from the growth temperature to room temperature. This strain can be modified by the ICCL employed to provide a further method of controlling the interface charge density in these devices. For example, Perry et al. have demonstrated that GaN grown on SiC can have residual compressive strain if an AlN layer is employed in-between the GaN and SiC due to the mechanical compressive strain between the GaN and AlN layer that exceeds the tensile strain induced by cooling. For a further discussion, see Perry, W. G., et al, Journal Electron. Mater. 26, 224 (1997), hereby incorporated by reference. An (Al)GaN ICCL (as shown, for example, as 5 in FIG. 24) could provide similar benefits for a GaN/SiC PE SAM APD. For the specific case of a GaN absorption layer 3A and a SiC multiplication layer 2A the ICCL 5F in this case could be (Al)GaN (AlN mole fraction >0), (In)AlN or a quaternary alloy of these compounds (FIG. 24), while for an InGaN absorption layer 3B and a SiC multiplication layer 2A, the ICCL 5G could be (Al)GaN, (In)AlN or a quaternary alloy of these compounds, or (In)GaN of lower InN mole fraction than that of the InGaN absorption region (FIG. 25).

FIG. 24 illustrates the structure of a specific case comprising a GaN/SiC PE-SAM APD employing a III-Nitride semiconductor ICCL 5F. The ICCL 5F may be composed of (Al)GaN, (In)AlN or an alloy of these compounds. Polarization discontinuity between absorption/multiplication regions and the ICCL layer induces a dipole within layer that induces a two dimensional electron gas $\sigma_{2DEG}$ at the interface that compensates the positive interface charge such that $(\sigma - \sigma_{2DEG})/\in\in_o$ is less than $F_{SiC}^{br}$, and $F_{GaN} > 0$.

FIG. 25 illustrates a specific case comprising of a InGaN/SiC PE-SAM APD employing a III-Nitride semiconductor ICCL 5G. The ICCL 5G may be composed of (Al)GaN, (In)AlN or an alloy of these compounds or an (In)GaN of lower InN mole fraction than that of the InGaN absorption region. Polarization discontinuity between absorption/multiplication regions and GaN the ICCL layer induces a dipole within layer that induces a two dimensional electron gas $\sigma_{2DEG}$ at the interface that compensates the positive interface charge such that $(\sigma - \sigma_{2DEG})/\in\in_o$ is less than $F_{SiC}^{br}$, and $F_{InGaN} > 0$.

Figure 26B:
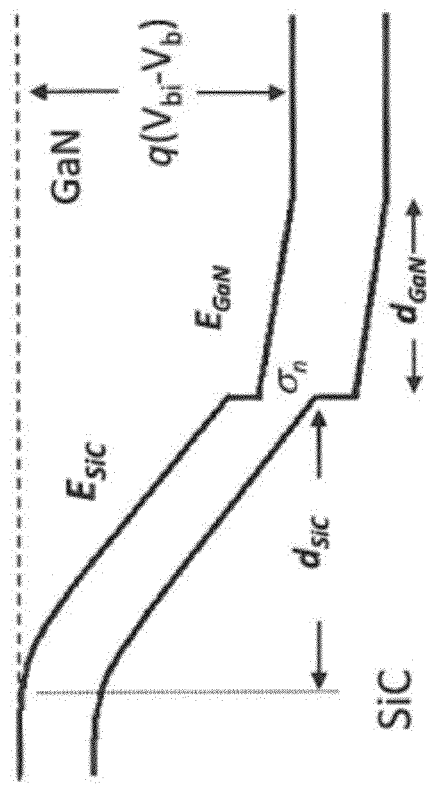
FIG. 26B is an illustration of a band diagram of a GaN/SiC APD under reverse bias with electric field confined in the SiC multiplication region due to the presence of polarization induced charge $\sigma$ at the interface.
Figure 26A:
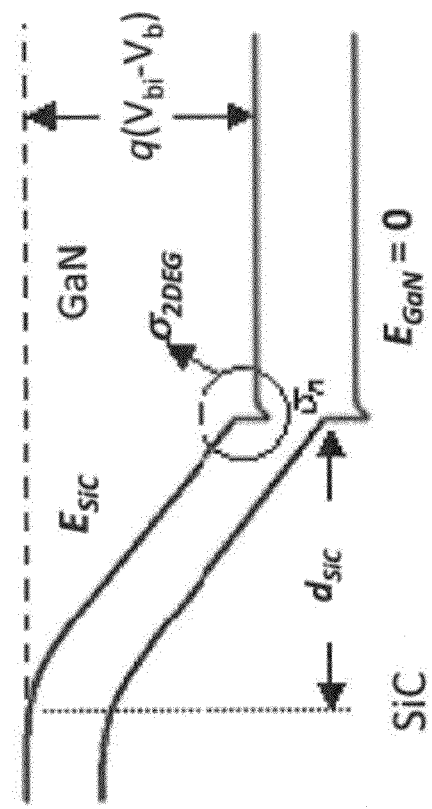
FIG. 26A is an illustration of a band diagram of a GaN/SiC APD under reverse bias with electric field showing punch-through into the GaN absorption region.

To appreciate the role of polarization-induced interface charge in practice, consider the specific case of a GaN/4H-SiC APD structure consisting of a 480 nm thick n-type SiC multiplication region doped ~$5 \times 10^{15}$ Cm$^{-3}$, that has been demonstrated to yield low dark current SiC APDs[1], and a 300 nm thick n-type GaN layer doped ~$1 \times 10^{16}$ cm$^{-3}$, so as to have nearly full absorption above the band gap of GaN in the absorption region for high QE. The net interface charge in this detector is calculated to be between ~0.013-0.023 C/m$^2$, using ~0.034 C/m$^2$ as the spontaneous polarization in GaN and 0.011-0.021 C/m$^2$ for 4H—SiC, based upon the work of Bai et al. "Determination of the electric field in 4H/3C/4H—SiC quantum wells due to spontaneous polarization in the 4H SiC matrix," *Appl. Phys. Lett.*, Vol. 83, 3171-3173 (2003). The net interface charge may be substantial for the lower estimate of the spontaneous polarization for 4H—SiC, therefore preventing punch-through prior to avalanche breakdown in this detector (FIG. 26B).

Figure 27A:
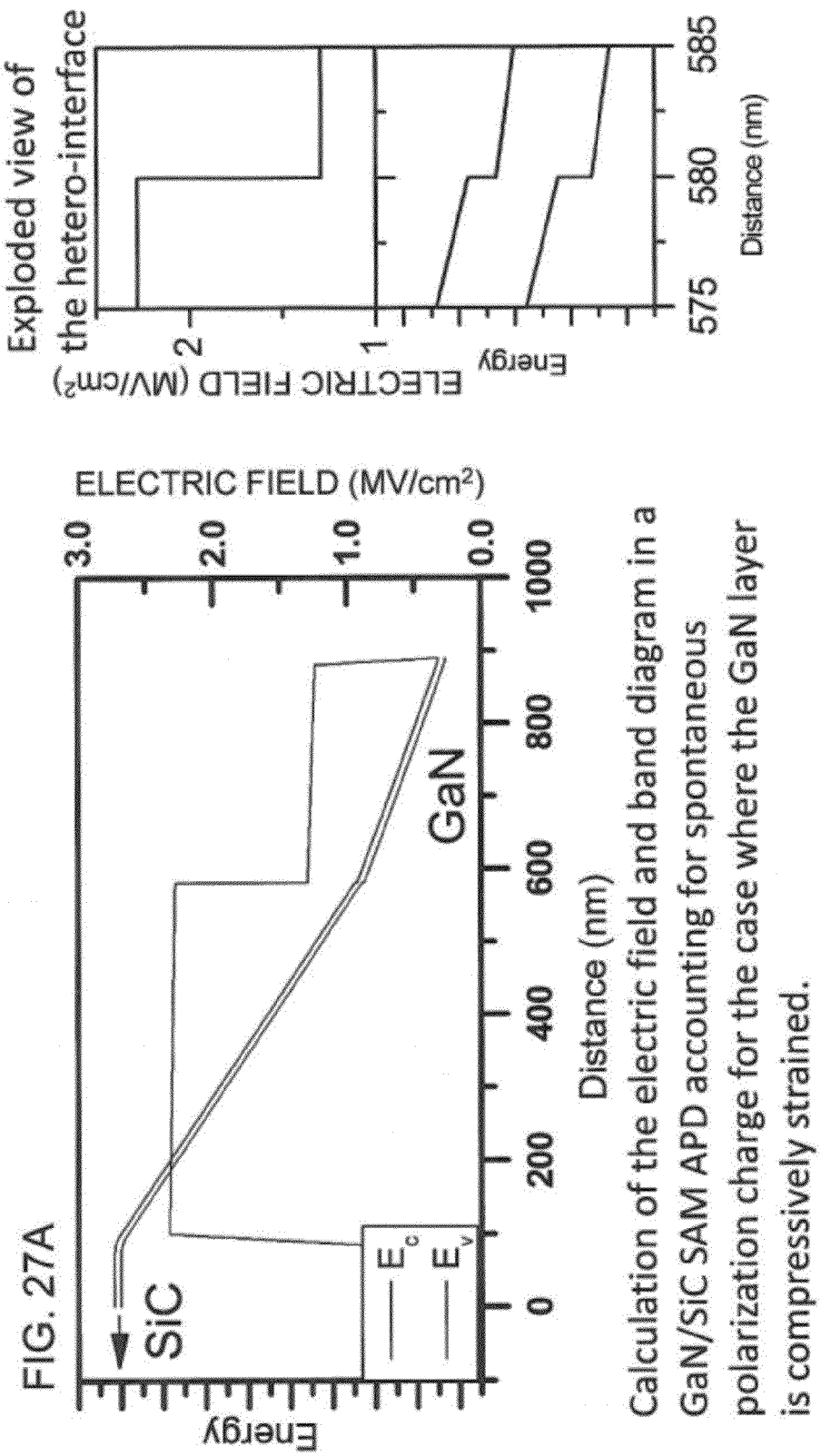
FIG. 27A is graphical illustration of the calculation of the electric field and band diagram in a GaN/SiC SAM APD accounting for spontaneous polarization charge for the case where the GaN layer is compressively strained.

One approach to controlling the interface charge in this device is to employ strain engineering, since GaN is a piezoelectric material. Compressive strain in the GaN absorption region can reduce the net interface charge by inducing a piezoelectric charge with opposite sign to that of the spontaneous polarization charge, while tensile strain will increase the net interface charge. FIG. 27A shows the calculated electric field profile for the GaN/SiC SAM APD biased just short of avalanche breakdown and assuming the GaN layer is compressively strained (−0.24). This strain state induces a piezoelectric charge that reduces the net interface charge to ~0.1 C/m², thus allowing punch-through prior to avalanche breakdown. It is important to note that the presence of positive polarization charge at the hetero-interface is shown to result in an atomically sharp transition between the high electric field desired in the multiplication layer to ensure large gain and the low (but non-zero) electric field desired in the absorption layer to efficiently collect photogenerated carriers. This will substantially reduce the operating voltage of such a device over a similar structure employing a conventional charge layer. The electric field profile for a conventional SAM APD employing a charge layer is illustrated in FIG. 2 bottom for comparison.

Figure 27B:
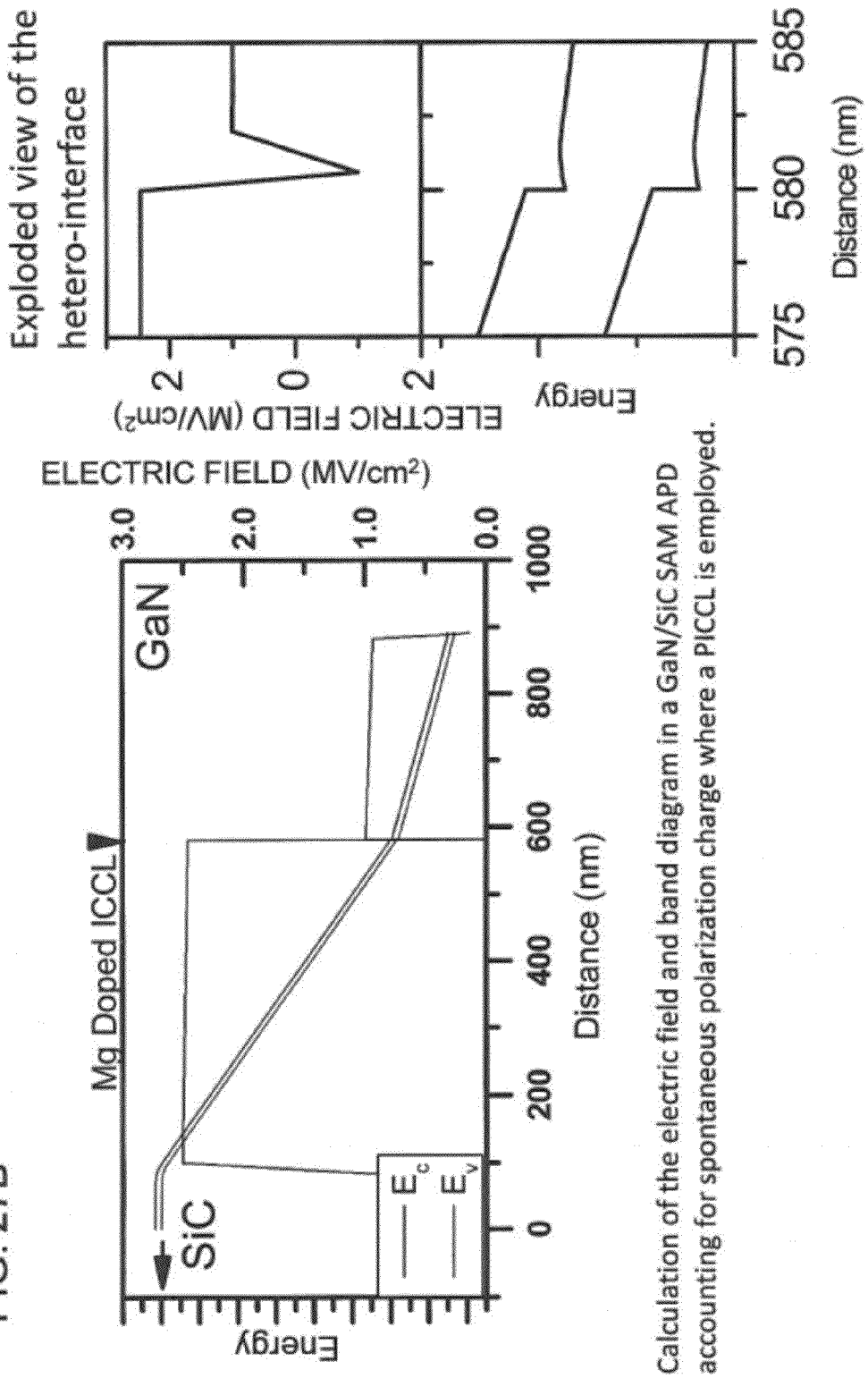
FIG. 27B is graphical illustration of the calculation of the electric field and band diagram in a GaN/SiC SAM APD accounting for spontaneous polarization charge where a PICCL is employed.

An alternative approach is to introduce charge at the interface through dopants. This interface charge control layer (ICCL) can contain ionized acceptors or donors to provide negative or positive charge, respectively. To illustrate this concept, FIG. 27B shows the calculated electric field distribution in a GaN/SiC APD employing a 2 nm Mg doped p-type ICCL (PICCL) at the hetero-interface that introduces a negative interface charge density of 0.11 C/m². This charge is sufficient to allow punch-through of the electric field into the GaN absorption region, but also introduces a small barrier for hole transport into the SiC multiplication region (FIG. 26B). It is important to note that the presence of positive polarization charge and ICCL at the hetero-interface is shown to result in an atomically sharp transition between the high electric field desired in the multiplication layer to ensure large gain and the low (but non-zero) electric field desired in the absorption layer to efficiently collect photogenerated carriers. This will substantially reduce the operating voltage of such a device over a similar structure employing a conventional charge layer. The electric field profile for a conventional SAM APD employing a charge layer as illustrated in FIG. 2 bottom for comparison.

Figure 27C:
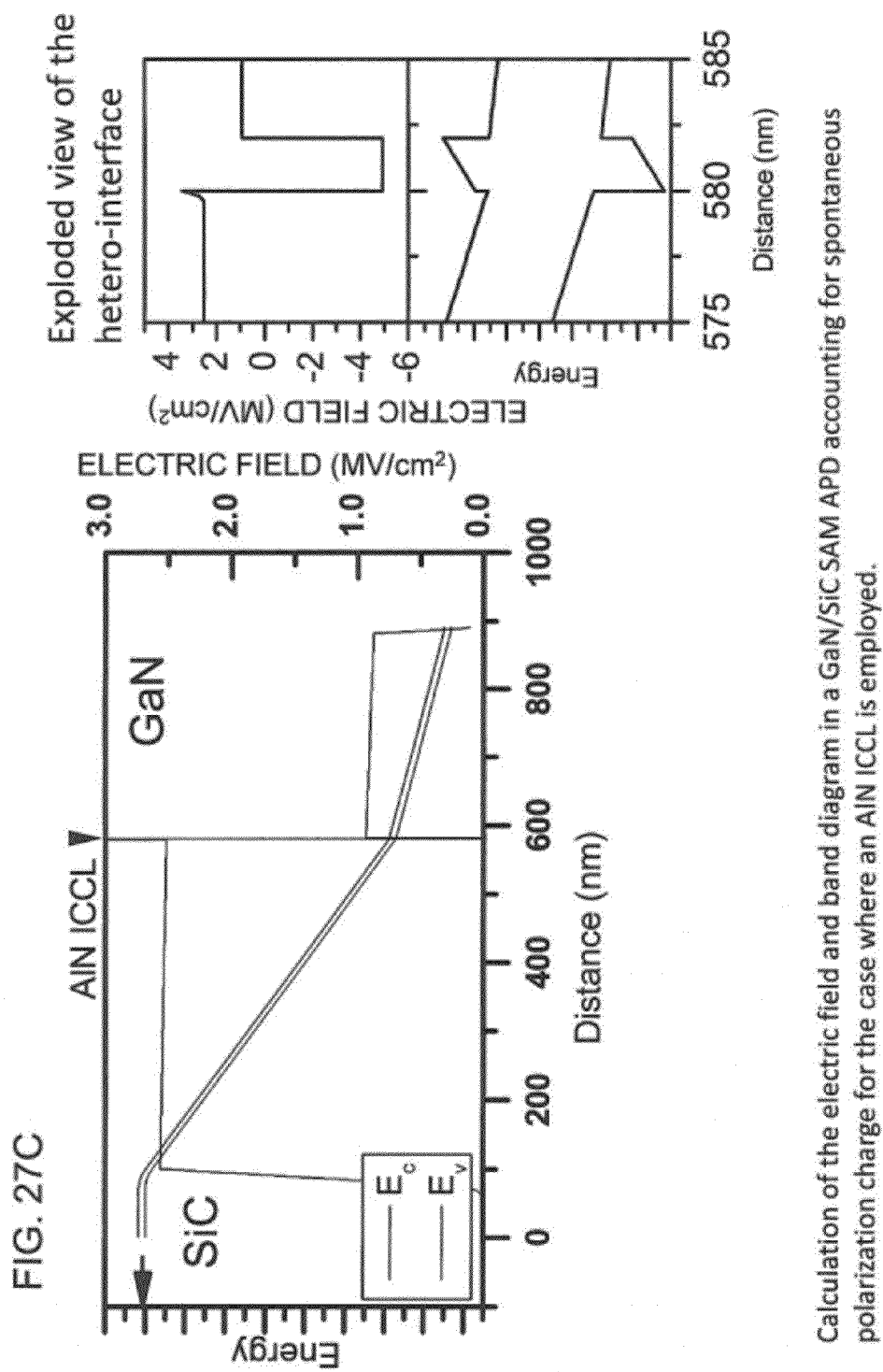
FIG. 27C is graphical illustration of the calculation of the electric field and band diagram in a GaN/SiC SAM APD accounting for spontaneous polarization charge for the case where an AlN ICCL is employed.

A third approach is to introduce a layer having larger spontaneous polarization than the absorption or multiplication region, for example, an AlN ICCL. This charge control layer introduces a type I band alignment between AlN and SiC that creates a 2DEG in the SiC multiplication region, as shown in FIG. 27C, with the effect of reducing the net interface charge density. However, the AlN ICCL also introduces a significant barrier for hole transport into the SiC multiplication region that may reduce carrier collection efficiency. This barrier may be reduced by employing an AlGaN ICCL having lower spontaneous polarization than AlN but still having sufficient band gap energy so as to maintain a type-I band alignment and a dipole at the hetero-interface. It is important to note that the presence of positive polarization charge and ICCL at the hetero-interface is shown to result in an atomically sharp transition between the high electric field desired in the multiplication layer to ensure large gain and the low (but non-zero) electric field desired in the absorption layer to efficiently collect photogenerated carriers. This will substantially reduce the operating voltage of such a device over a similar structure employing a conventional charge layer. The electric field profile for a conventional SAM APD employing a charge layer as illustrated in FIG. 2 bottom for comparison.

While this discussion treats the case of a III-Nitride/SiC PE-SAM APD structure designed for the multiplication of holes and therefore employing a net positive interface charge, inverse arguments, including inversion of the crystal polarity to N-face, apply for a device designed for electron multiplication. In this case, the formation of a negative polarization charge is desirable. An important example of this case would be a III-Nitride/Si (111) APD, which would require a p-type, III-polar III-Nitride contact layer and an unintentionally doped III-polar absorption region for efficient electron collection.

As used herein (in the drawings, specification, abstract and claims), the term "light" means electromagnetic radiation, unless specifically noted to the contrary. In the drawings, the symbol λ means electromagnetic radiation.

As used herein, the terminology "avalanche multiplication layer" or "multiplication layer" means a layer or layers in which the carriers predominantly multiply. The carriers may be either holes and/or electrons.

As used herein, the terminology "absorption layer", "absorption region", "absorber", "absorber region" means a layer or layers or region or regions in which photons are predominantly absorbed and photogenerated carriers created.

As used herein, the terminology (In)GaN refers to the binary compound GaN or a ternary compound of InGaN having arbitrary mole fraction of InN.

As used herein, the terminology (Al)GaN refers to the binary compound GaN or a ternary compound of AlGaN having arbitrary mole fraction of AlN.

As used herein, the terminology (Al)(In)GaN or (In)(Al)GaN refers to the binary compound GaN or ternary or quaternary III-Nitride semiconductor compound having arbitrary mole fractions of InN and/or AlN.

As used herein $F_{br}$ is the field in the multiplication layer or region, σ is interface charge, $F_{AB}$ is the field in the absorption region, $\in$ is the dielectric constant, $\in_0$ is the permittivity in free space.

As used herein, the terminology (In)AlN refers to the binary compound AlN or ternary compound having arbitrary mole fractions of InN. As used herein the term P in bold face represents the magnitude of the polarization vector.

As used herein the phrase "p-side down" refers to an avalanche photodiode structure where the p-type portion of the detector p-n junction is nearest to, or a part of, the substrate.

As used herein the phrase "n-side down" refers to an avalanche photodiode structure where the n-type portion of the detector p-n junction is nearest to, or a part of, the substrate.

As used in the following claims, the term "device" is not intended to be limiting and includes an apparatus or system. Systems or devices of this nature are represented, for example, in FIGS. 1, 4, 13, 16, 19, 24, 26 and 27. The terminology "layer" as used in the following claims is not intended to be limiting; including as to size or dimension. The "layer" as used in the claims may be part of a composite device composed of various layers or regions and the "layer" may be a part of a uniform material. The term "layer" means "region."

As used herein the terminology "doped charge layer" means a doped semiconductor layer to create a specified charge density.

As used herein the terminology "transition distance" is the distance required to transition from the low field in the absorption layer to the high field in the multiplication layer.

As used herein the terminology "abruptly" means all at once.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation.

Therefore, while the embodiments herein have been described in terms of preferred embodiments, those skilled in the art will recognize that the embodiments herein can be practiced with modification within the spirit and scope of the appended claims.

The invention claimed is:

1. An avalanche photodetector comprising:
a multiplication layer formed of a first material having a first polarization; the multiplication layer having a first electric field upon application of a bias voltage;
an absorption layer formed of a second material having a second polarization forming an interface with the multiplication layer; the absorption layer having a second electric field upon application of the bias voltage, the second electric field being less than the first electric field or substantially zero, carriers created by light absorbed in the absorption layer being multiplied in the multiplication layer due to the first electric field; the absorption layer having a second polarization which is greater or less than the first polarization to thereby create an interface charge; the interface charge being positive when the first material predominately multiplies holes, the interface charge being negative when the first material predominately multiplies electrons, the change in electric field at the interface occurring abruptly at the atomic level;
the interface charge creating electric field discontinuity causing first electric field to attain the breakdown field in the multiplication region and the second electric field to be low or zero in the absorption layer to thereby eliminate the need for a doped charge layer and the associated thickness of the doped charge layer required to transition from the low field to the high field.

2. The photodetector of claim 1 wherein the device is an avalanche photodetector wherein by eliminating the need for a doped charge layer, such that the transition from the low field in the absorption layer to the breakdown field in the multiplication layer occurs abruptly on the atomic scale at the interface and the required transition distance is eliminated resulting in only the minimum voltage being necessary to achieve the breakdown field required to trigger the avalanche breakdown.

3. The photodetector of claim 1 comprising first and second electrodes having a voltage potential therebetween sufficient to create a high first electric field in the multiplication layer for avalanche breakdown; the interface charge operating to confine the high first electric field to the multiplication layer, the high first electric field being the field required for avalanche breakdown, while a low or zero second electric field is maintained in the absorption layer.

4. The photodetector of claim 1 wherein the photodetector is a P-N diode and wherein the absorption layer comprises a Group II or Group III polar n-type material suitable for injection of holes into the multiplication layer and where the direction of vectors P1 and P2 are from multiplication layer towards the absorption layer and wherein the magnitude of the second polarization is greater than the magnitude of the first polarization such that the interface charge is positive.

5. The photodetector of claim 1 wherein the photodetector is a P-N diode and the absorption layer comprises a Group V or Group VI polar p-type material suitable for injection of electrons into the multiplication region and wherein the direction of polarization vectors P1 and P2 are from absorption layer towards the multiplication layer and magnitude of P2 is greater than magnitude of P1 such that the interface charge is negative.

6. The photodetector of claim 1 wherein the photodetector is a P-N diode and the absorption layer comprises a Group V or Group VI polar n-type material suitable for injection of holes into the multiplication region and wherein the direction of polarization vectors P1 and P2 are from absorption layer towards the multiplication layer and magnitude of P2 is less than magnitude of P1 such that the interface charge is positive.

7. The photodetector of claim 1 wherein the photodetector is a P-N diode and the absorption layer comprises a Group II or Group III polar p-type material suitable for injection of electrons into the multiplication region and wherein the direction of polarization vectors P1 and P2 are from the multiplication layer towards the absorption layer and magnitude of P2 is less than magnitude of P1 such that the interface charge is negative.

8. The photodetector of claim 1 wherein the multiplication layer is silicon carbide and the absorption layer is one of the group of gallium nitride, indium gallium nitride, aluminum gallium nitride, indium aluminum gallium nitride, indium aluminum nitride, boron aluminum nitride, boron aluminum gallium nitride, aluminum nitride, boron nitride, indium nitride.

9. The photodetector of claim 1 further comprising an interface charge control layer for creating a field in the absorption layer, the interface charge control layer being located between the multiplication layer and the absorption layer, and wherein the differential between the polarization of the absorption layer and polarization of the multiplication layer is in excess of the product of the breakdown field and the permittivity of the absorption layer relative to free space, the interface charge control layer operating to create a field in the absorption layer by compensating the effective interface charge until it is less than the product of the breakdown field of the multiplication layer and the permittivity of the absorption layer relative to free space.

10. The photodetector of claim 9 wherein the interface charge control layer has a thickness in the range of approximately 2 to 20 nm.

11. The photodetector of claim 9 wherein the second polarization is greater than the first polarization and wherein the interface charge control layer has a third polarization greater than the second polarization that operates to effectively reduce the positive interface charge between the multiplication layer and the charge control layer.

12. The photodetector of claim 9 wherein the third polarization is graded to the second polarization by grading the composition of the interface charge control layer down to that of the composition of the absorption layer.

13. The photodetector of claim 9 wherein the interface charge control layer is grown on the multiplication layer such that the third polarization is greater than the second polarization and induces a two dimensional electron gas $\sigma_{2DEG}$ at the interface between the multiplication layer and the charge control layer that compensates the positive interface charge such that $(\sigma-\sigma_{2DEG})/\epsilon\epsilon_o$ is less than $F_{br}$, where $\sigma$ is the interface charge, $\sigma_{2DEG}$ is a two dimensional electron gas, $F_{br}$ is the breakdown field and $\epsilon\epsilon_o$ is the permittivity of the absorption layer relative to free space.

14. The photodetector of claim 9 wherein the interface charge control layer comprises one of the group of gallium nitride, indium gallium nitride, aluminum gallium nitride, indium aluminum gallium nitride, indium aluminum nitride, boron aluminum nitride, boron aluminum gallium nitride, aluminum nitride, boron nitride, indium nitride provided that the third polarization is greater than the second polarization.

15. The photodetector of claim 9 wherein the photodetector is a P-N diode and wherein the absorption layer comprises a Group II or Group III polar n-type material and where the direction of vectors P1 and P2 are from multiplication layer towards the absorption layer and wherein the second polarization is greater than the first polarization and wherein the interface charge control layer is doped with acceptors and the ionized acceptors create a negative space charge that operates to effectively compensate the positive interface charge between the multiplication layer and the charge control layer.

16. The photodetector of claim 15 wherein the material of the multiplication layer comprises silicon carbide, the material of the absorption layer comprises one of the group of gallium nitride, indium gallium nitride, aluminum gallium nitride, indium aluminum gallium nitride, indium aluminum nitride, boron aluminum nitride, boron aluminum gallium nitride, aluminum nitride, boron nitride, indium nitride and the interface charge control layer comprises magnesium doped material of the absorption layer.

17. An avalanche photodetector comprising:
    a multiplication layer having a first polarization and a breakdown field;
    an absorption layer having a second polarization, the differential between the polarization of the absorption layer and polarization of the multiplication layer being in excess of the product of the breakdown field and the permittivity of the absorption layer relative to free space,
    an interface charge control layer for creating a field in the absorption layer, the interface charge control layer being located between the multiplication layer and the absorption layer,
    whereby the interface charge control layer operates to create a field in the absorption layer by reducing the effective interface charge until it is less than the product the breakdown field of multiplication layer and the permittivity of the absorption layer relative to free space.

18. The photodetector of claim 17 wherein the material of the multiplication layer comprises silicon carbide, the material of the absorption layer comprises one of the group of gallium nitride, indium gallium nitride, aluminum gallium nitride, indium aluminum gallium nitride, indium aluminum nitride, boron aluminum nitride, boron aluminum gallium nitride, aluminum nitride, boron nitride, indium nitride and the interface charge control layer comprises magnesium doped material of the absorption layer.

19. The photodetector of claim 17 wherein the second polarization is greater than the first polarization and wherein the interface charge control layer has a third polarization greater than the second polarization that operates to effectively reduce the positive interface charge between the multiplication layer and the charge control layer, wherein the interface charge control layer has a thickness in the range of approximately 2 to 20 nm and comprises one of the group of gallium nitride, indium gallium nitride, aluminum gallium nitride, indium aluminum gallium nitride, indium aluminum nitride, boron aluminum nitride, boron aluminum gallium nitride, aluminum nitride, boron nitride, indium nitride provided that the third polarization is greater than the second polarization.

20. A method of forming an avalanche photodetector comprising
    providing a substrate;
    forming a first doped semiconductor layer suitable for making electrical contact;
    forming a multiplication layer on the first doped semiconductor layer; the multiplication layer having a first polarization;
    forming an interface charge control layer on the multiplication layer,
    forming an absorption region on the interface charge control layer; the absorption layer having a second polarization; the interface charge control layer operating to create a field in the absorption layer, the interface charge control layer operating to create a charge that enables a transition between the high electric field desired in the multiplication layer to ensure large gain and the low electric field in the absorption layer to efficiently collect photon generated carriers;
    forming a second doped semiconductor layer suitable for making electrical contact on the absorption layer.

* * * * *